(12) United States Patent
Jang et al.

(10) Patent No.: US 10,326,050 B2
(45) Date of Patent: *Jun. 18, 2019

(54) LIGHT-EMITTING DEVICE WITH IMPROVED LIGHT EXTRACTION EFFICIENCY

(71) Applicant: SEOUL VIOSYS CO., LTD., Ansan-si (KR)

(72) Inventors: Jong Min Jang, Ansan-si (KR); Jong Kyun You, Ansan-si (KR); Da Hye Kim, Ansan-si (KR); Chae Hon Kim, Ansan-si (KR); Seon Min Bae, Ansan-si (KR); Jae Hee Lim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/551,575

(22) PCT Filed: Jan. 28, 2016

(86) PCT No.: PCT/KR2016/000911
§ 371 (c)(1),
(2) Date: Aug. 16, 2017

(87) PCT Pub. No.: WO2016/133292
PCT Pub. Date: Aug. 25, 2016

(65) Prior Publication Data
US 2018/0040767 A1 Feb. 8, 2018

(30) Foreign Application Priority Data

Feb. 16, 2015 (KR) .................. 10-2015-0023457
Mar. 6, 2015 (KR) .................. 10-2015-0031796

(51) Int. Cl.
*H01L 33/10* (2010.01)
*H01L 33/22* (2010.01)
(Continued)

(52) U.S. Cl.
CPC .............. *H01L 33/10* (2013.01); *H01L 33/16* (2013.01); *H01L 33/22* (2013.01); *H01L 33/32* (2013.01);
(Continued)

(58) Field of Classification Search
CPC ....... H01L 33/10; H01L 33/405; H01L 33/32; H01L 33/38; H01L 33/16; H01L 33/40; H01L 33/22
(Continued)

(56) References Cited

U.S. PATENT DOCUMENTS 9,653,645 B2 * 5/2017 Jang .................. H01L 33/025
2009/0302334 A1 12/2009 Yao et al.

FOREIGN PATENT DOCUMENTS

JP 2009094427 A 4/2009
JP 2012084667 A 4/2012
(Continued)

OTHER PUBLICATIONS

International Search Report in International Application No. PCT/KR2016/000911, dated May 24, 2016.
(Continued)

*Primary Examiner* — Caleen O Sullivan
(74) *Attorney, Agent, or Firm* — Perkins Coie LLP

(57) ABSTRACT

Disclosed is a light-emitting device. The light-emitting device comprises: a light-emitting structure comprising a first conductive semiconductor layer, a second conductive semiconductor layer, and an active layer disposed between the first conductive semiconductor layer and the second conductive semiconductor layer; a first contact electrode
(Continued)

which ohmically contacts the first conductive semiconductor layer; a second contact electrode which is disposed on the second conductive semiconductor layer; and an insulation layer which is disposed on the light-emitting structure and insulates the first contact electrode and the second contact electrode, wherein the light-emitting structure has a non-polar or semi-polar growth surface; the upper surface of the second conductive semiconductor layer comprises a non-polar or semi-polar surface; and the second contact electrode comprises a conductive oxide layer which ohmically contacts the second conductive semiconductor layer, and a reflective electrode layer disposed on the conductive oxide layer.

45 Claims, 10 Drawing Sheets

(51) Int. Cl.
*H01L 33/38* (2010.01)
*H01L 33/32* (2010.01)
*H01L 33/40* (2010.01)
*H01L 33/16* (2010.01)
*H01L 33/42* (2010.01)
*H01L 33/00* (2010.01)
*H01L 33/20* (2010.01)

(52) U.S. Cl.
CPC .............. *H01L 33/38* (2013.01); *H01L 33/40* (2013.01); *H01L 33/405* (2013.01); *H01L 33/42* (2013.01); *H01L 33/0075* (2013.01); *H01L 33/20* (2013.01)

(58) Field of Classification Search
USPC .......................................................... 257/91
See application file for complete search history.

(56) References Cited

FOREIGN PATENT DOCUMENTS

| | | |
|---|---|---|
| KR | 1020140066397 A | 6/2014 |
| KR | 1020150014136 A | 2/2015 |
| WO | 2015016561 A1 | 2/2015 |

OTHER PUBLICATIONS

Office Action dated Jul. 27, 2018 in Chinese Patent Application No. 201680010321.7, 23 pages.

* cited by examiner

【FIG. 1A】
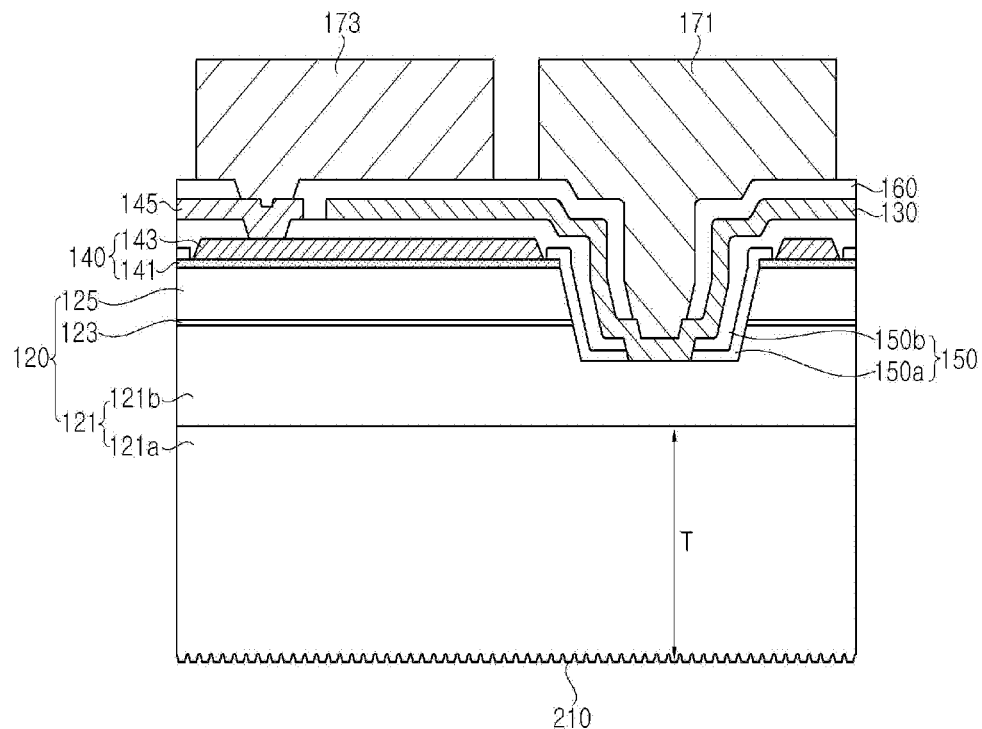
【FIG. 1B】
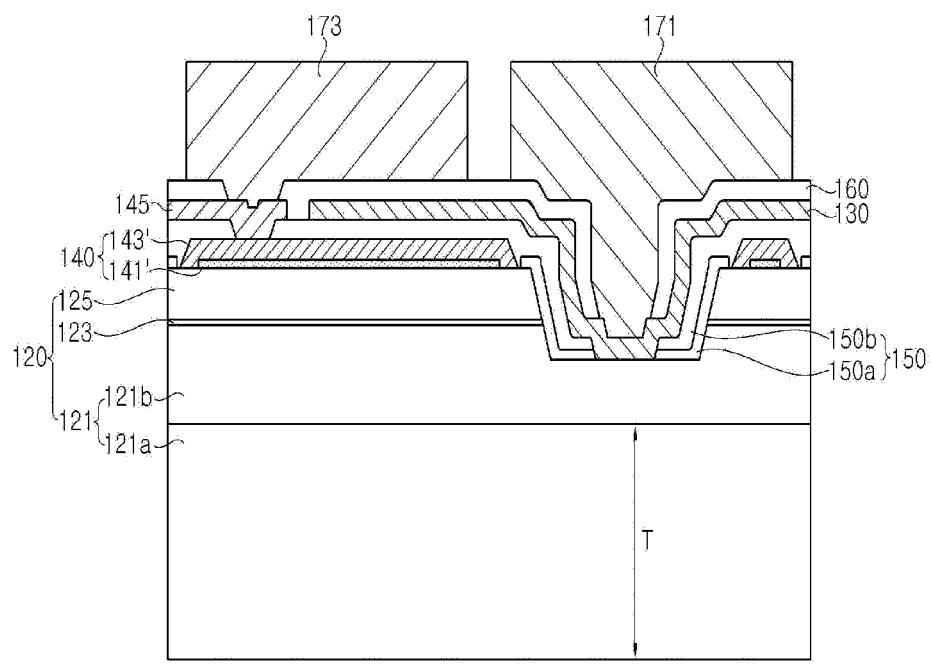

【FIG. 2】
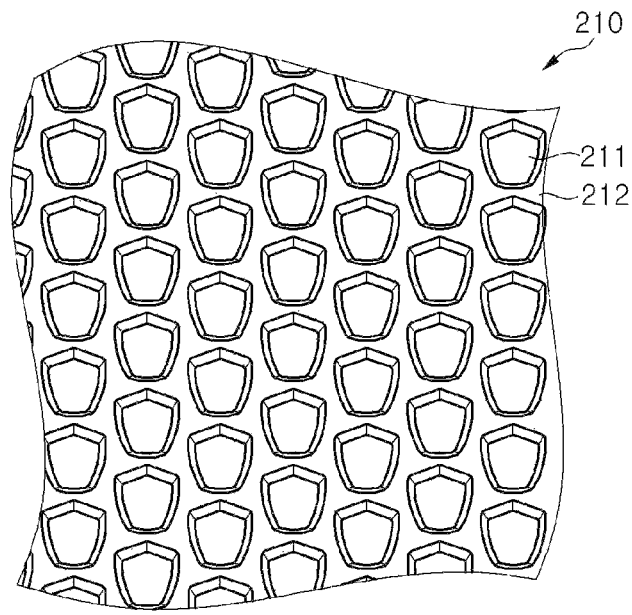
【FIG. 3A】
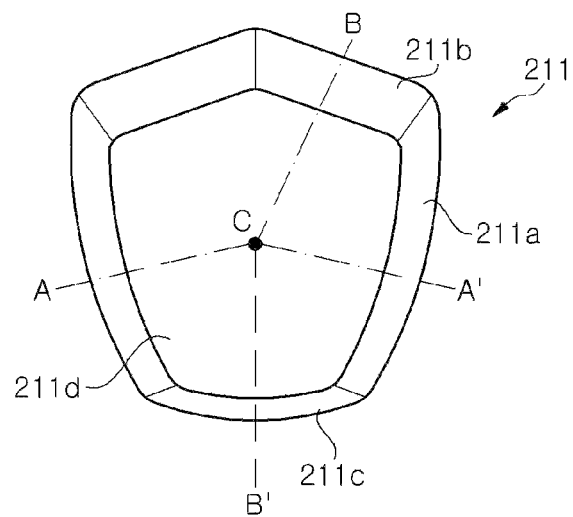

[FIG. 3B]
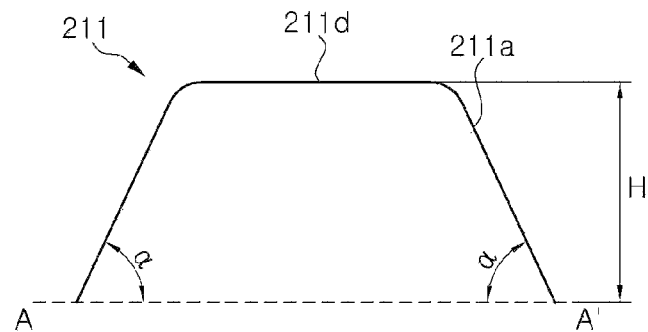
[FIG. 3C]
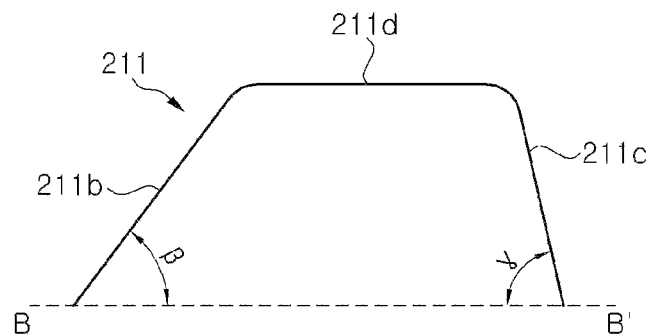
[FIG. 4]
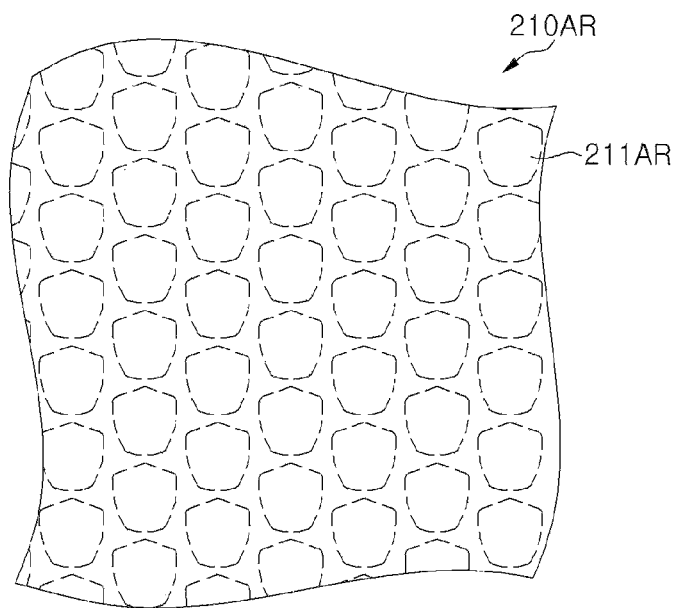

[FIG. 5]
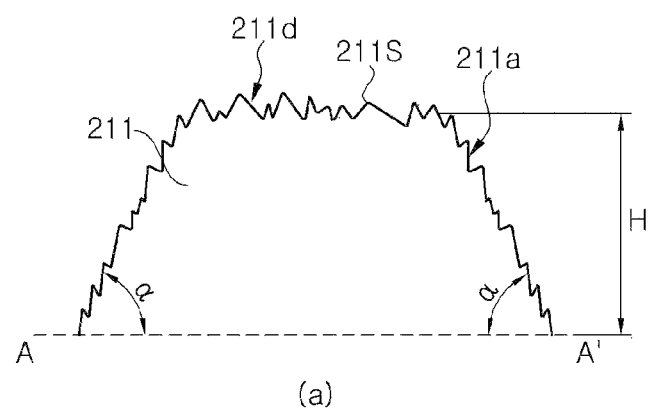
(a)
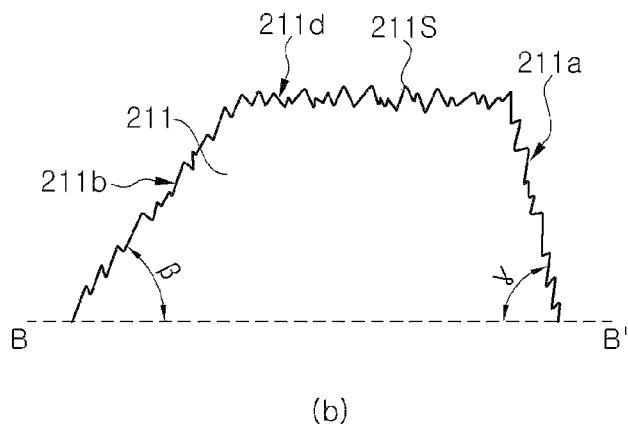
(b)

[FIG. 6]
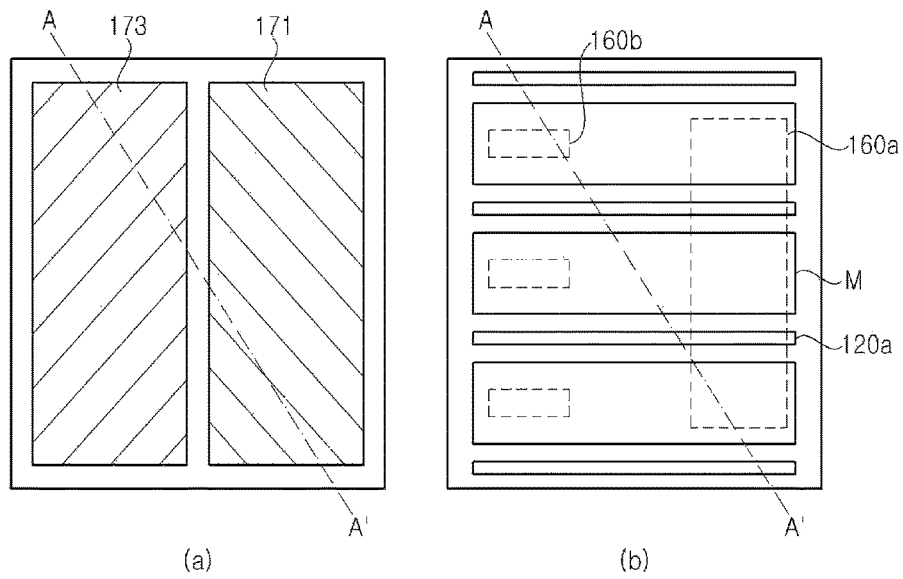
(a)  (b)
[FIG. 7]
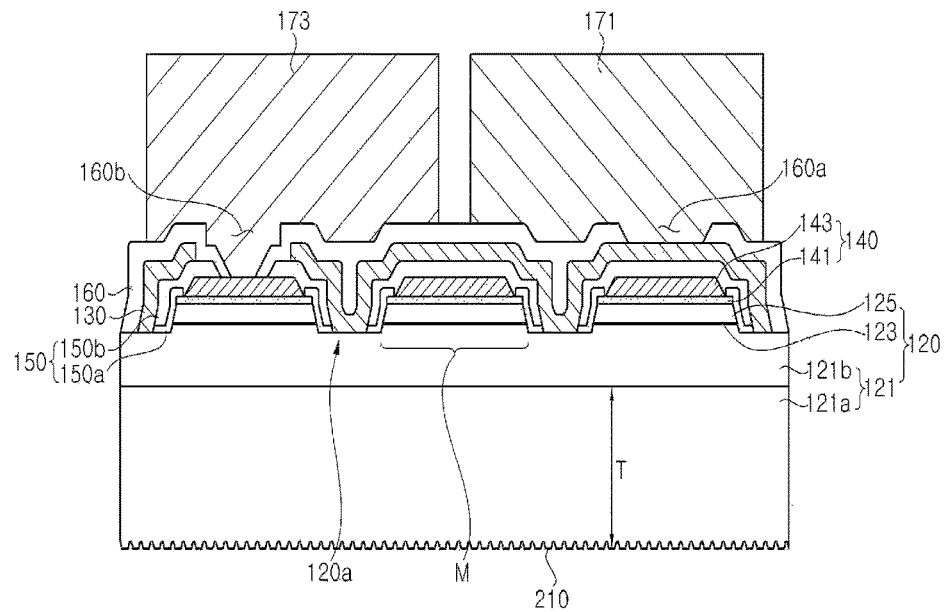

[FIG. 8]
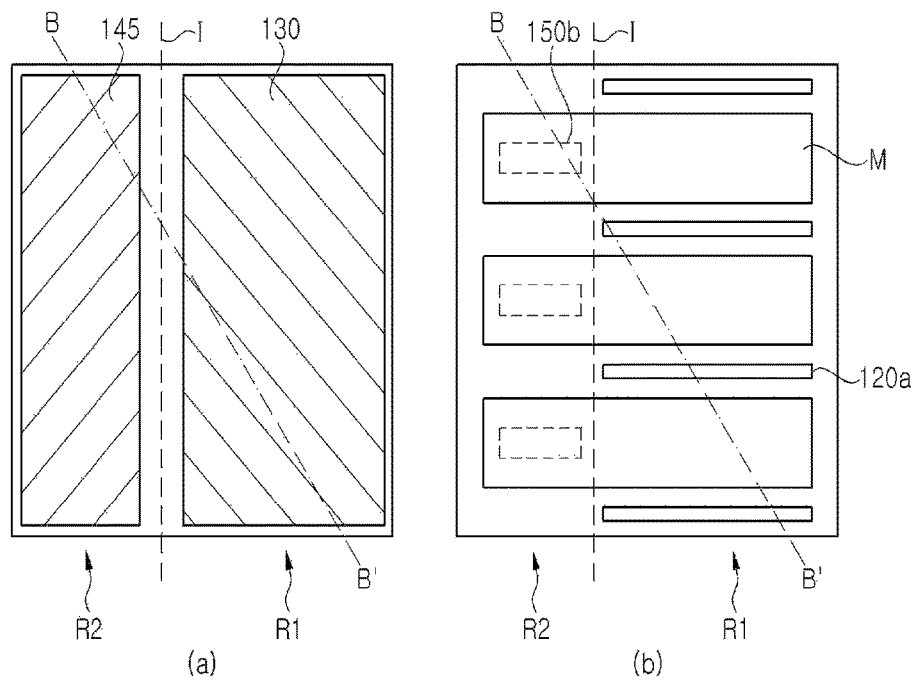
[FIG. 9]
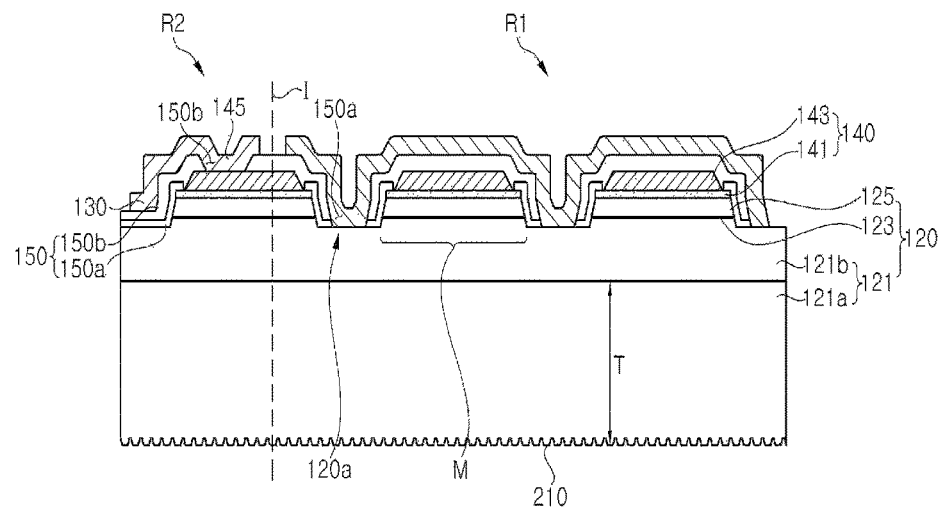

[FIG. 10]
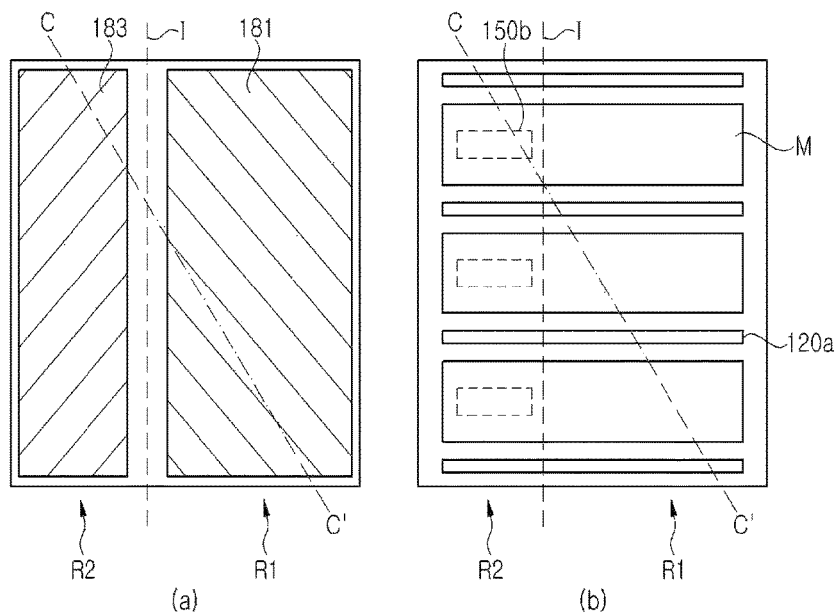
[FIG. 11]
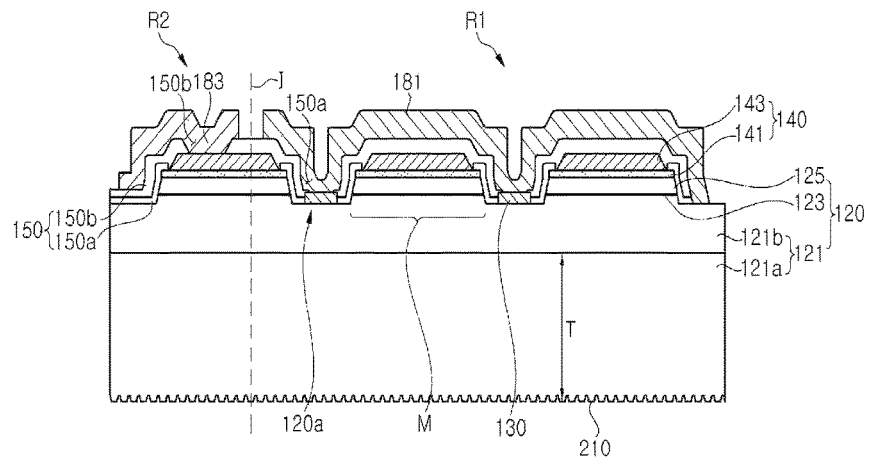

[FIG. 12]
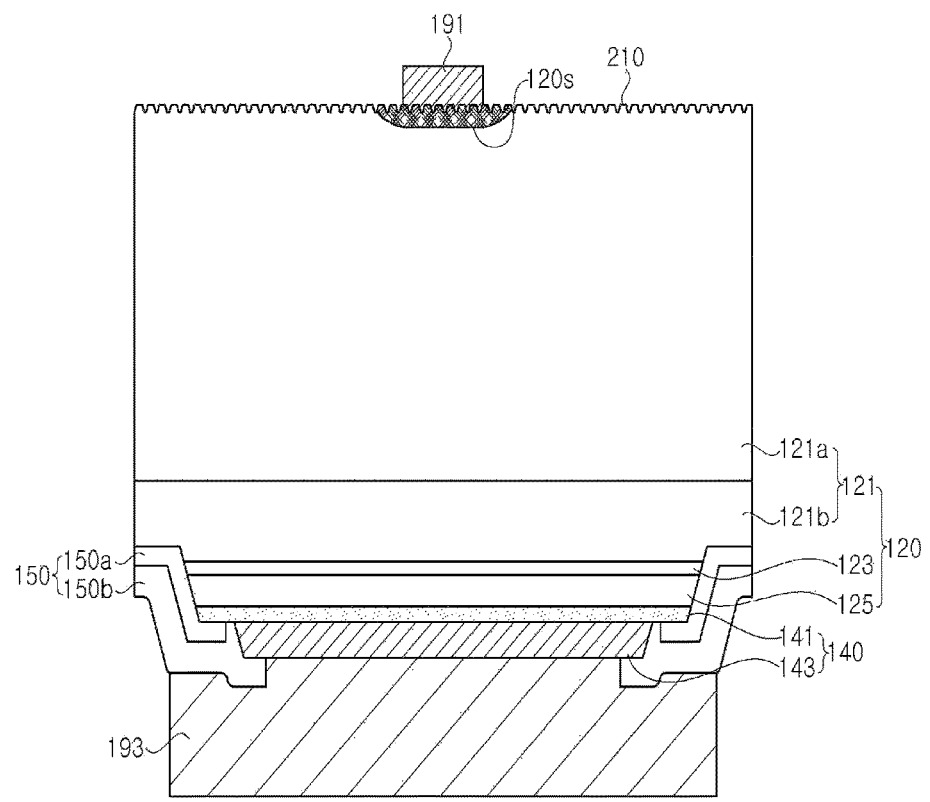

[FIG. 13]
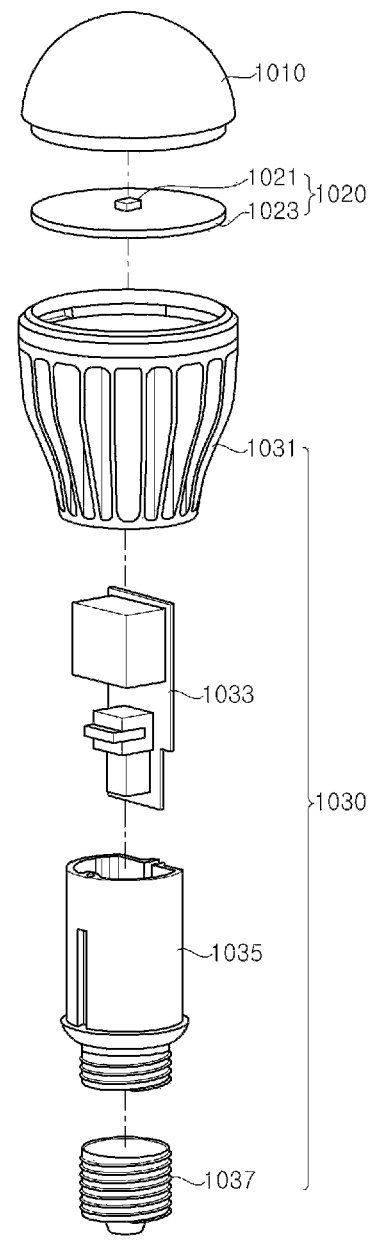

[FIG. 14]
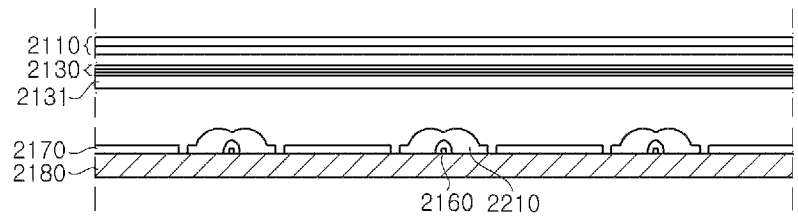
[FIG. 15]
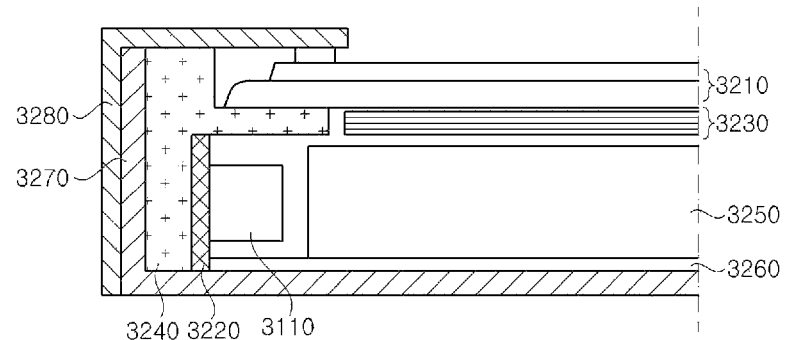
[FIG. 16]
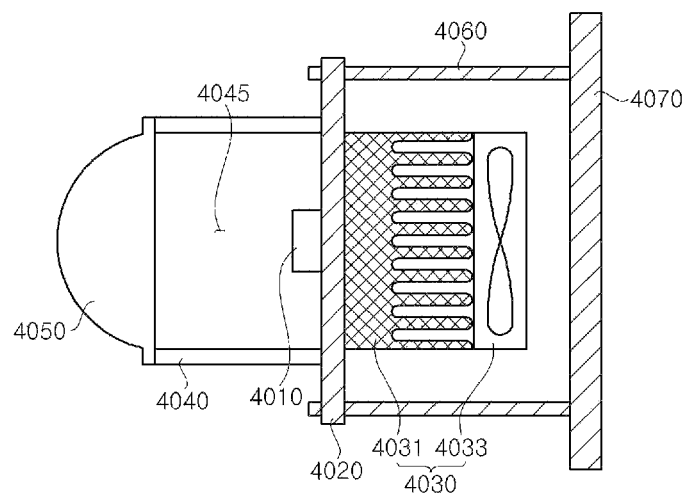

LIGHT-EMITTING DEVICE WITH IMPROVED LIGHT EXTRACTION EFFICIENCY

TECHNICAL FIELD

Exemplary embodiments of the present disclosure relate to a light emitting device and, particularly, to a light emitting device that includes a light exit surface with high roughness to improve light extraction efficiency.

BACKGROUND ART

Recently, with increasing demand for small and high output light emitting apparatuses, demand for large flip-chip type light emitting devices and vertical light emitting devices having high heat dissipation efficiency and applicable to such high output light emitting apparatuses also increases. Since the flip-chip type or vertical light emitting device includes an electrode directly bonded to a secondary substrate, the flip chip type or vertical light emitting device has much better heat dissipation efficiency than a lateral light emitting device. Thus, since such a flip chip type or vertical light emitting device can effectively transfer heat towards the secondary substrate even upon application of high density current, the flip-chip type and vertical light emitting devices are suitable for a light source for high output light emitting apparatuses.

On the other hand, a typical nitride-based light emitting device is fabricated by growing a nitride-based semiconductor layer on a growth substrate having the c-plane as a growth plane, such as a sapphire substrate. However, since the c-plane as the growth plane has polarity in a direction in which electrons and holes are combined, spontaneous polarization and piezoelectric polarization occur in a grown nitride-based semiconductor layer. Such a polarization phenomenon deteriorates internal quantum efficiency of the light emitting device, thereby causing efficiency droop. In addition, a sapphire substrate used as the growth substrate has low thermal conductivity, thereby reducing heat dissipation efficiency of the light emitting device and causing deterioration in lifespan and luminous efficacy of the light emitting device. Such a typical light emitting device suffers from more significant deterioration in efficiency during operation at high current.

In order to overcome such problems, a light emitting device is fabricated using a non-polar or semi-polar homogeneous growth substrate. Efficiency deterioration due to spontaneous polarization and piezoelectric polarization can be minimized by growing non-polar or semi-polar nitride semiconductors on the homogeneous substrate. A nitride-based semiconductor has non-polar planes including an a-plane ({11-20}) and an m-plane ({1-100}), and various light emitting devices fabricated by growing nitride-based semiconductors on the m-plane non-polar substrate are disclosed in the related art.

However, a non-polar nitride-based semiconductor layer grown on the m-plane as the growth plane exhibit different growth characteristics, optical characteristics, etching characteristics, and the like than a non-polar nitride-based semiconductor layer grown on the c-plane as the growth plane. Particularly, in order to improve light extraction efficiency, a surface treatment technique applied to a semiconductor layer grown on the c-plane is difficult to apply to a semiconductor layer having a non-polar or semi-polar growth plane.

DISCLOSURE

Technical Problem

Exemplary embodiments of the present disclosure provide light emitting devices grown along a non-polar or semi-polar growth plane and having improved light extraction efficiency.

Technical Solution

In accordance with one aspect of the present disclosure, a light emitting device includes: a light emitting structure including a first conductivity type semiconductor layer, a second conductivity type semiconductor layer, and an active layer interposed between the first conductivity type semiconductor layer and the second conductivity type semiconductor layer; a first contact electrode in ohmic contact with the first conductivity type semiconductor layer; a second contact electrode disposed on the second conductivity type semiconductor layer; and an insulation layer disposed on the light emitting structure and insulating the first contact electrode from the second contact electrode, wherein the light emitting structure has a non-polar or semi-polar growth plane, an upper surface of the second conductivity type semiconductor layer includes a non-polar or semi-polar plane, and the second contact electrode includes a conductive oxide layer in ohmic contact with the second conductivity type semiconductor layer and a reflective electrode layer disposed on the conductive oxide layer.

Advantageous Effects

Exemplary embodiments of the present disclosure provide a method of forming a plurality of protrusions on a surface of a light emitting structure having a non-polar or semi-polar growth plane. Particularly, exemplary embodiments of the present disclosure provide a light emitting device having further improved light extraction efficiency through novel surface treatment instead of typical surface treatment applied to a semiconductor layer grown on the c-plane.

DESCRIPTION OF DRAWINGS

FIG. 1A is a sectional view of a light emitting device according to one exemplary embodiment of the present invention.

FIG. 1B is a sectional view of a light emitting device according to another exemplary embodiment of the present invention.

FIG. 2 is a plan view of the light emitting device according to the exemplary embodiment of the present invention.

FIGS. 3A, 3B, and 3C are plan views and sectional views illustrating protrusions formed on a surface of the light emitting device according to the exemplary embodiment of the present invention.

FIG. 4 is a plan view illustrating the surface of the light emitting device according to the exemplary embodiment of the present invention.

FIG. 5 is sectional views illustrating a surface of a light emitting device according to another exemplary embodiment of the present invention.

FIG. 6 and FIG. 7 are plan views and a sectional view of a light emitting device according to a further exemplary embodiment of the present invention.

FIG. 8 and FIG. 9 are plan views and a sectional view of a light emitting device according to yet another exemplary embodiment of the present invention.

FIG. 10 and FIG. 11 are plan views and a sectional view of a light emitting device according to yet another exemplary embodiment of the present invention.

FIG. 12 is a sectional view of a light emitting device according to yet another exemplary embodiment of the present invention.

FIG. 13 is an exploded perspective view of one embodiment of a lighting apparatus to which a light emitting device according to one exemplary embodiment is applied.

FIG. 14 is a cross-sectional view of one embodiment of a display apparatus to which a light emitting device according to one exemplary embodiment of the present disclosure is applied.

FIG. 15 is a cross-sectional view of another embodiment of the display apparatus to which a light emitting device according to one exemplary embodiment of the present disclosure is applied.

FIG. 16 is a cross-sectional view of a headlight to which a light emitting device according to one exemplary embodiment of the present disclosure is applied.

BEST MODE

A light emitting device according to various exemplary embodiments may be realized in various ways.

A light emitting device according to various exemplary embodiments includes: a light emitting structure including a first conductivity type semiconductor layer, a second conductivity type semiconductor layer, and an active layer interposed between the first conductivity type semiconductor layer and the second conductivity type semiconductor layer; a first contact electrode in ohmic contact with the first conductivity type semiconductor layer; a second contact electrode disposed on the second conductivity type semiconductor layer; and an insulation layer disposed on the light emitting structure and insulating the first contact electrode from the second contact electrode, wherein the light emitting structure has a non-polar or semi-polar growth plane, an upper surface of the second conductivity type semiconductor layer includes a non-polar or semi-polar plane, and the second contact electrode includes a conductive oxide layer in ohmic contact with the second conductivity type semiconductor layer and a reflective electrode layer disposed on the conductive oxide layer.

The light emitting structure may include a nitride semiconductor and the non-polar or semi-polar growth plane may include the m-plane.

The conductive oxide layer may include indium tin oxide (ITO) and the reflective electrode layer may include Ag.

The conductive oxide layer may have a larger area than the reflective electrode layer and the reflective electrode layer may be disposed in a peripheral region of the conductive oxide layer.

The conductive oxide layer may cover 90% or more of an upper surface of the second conductivity type semiconductor layer.

The conductive oxide layer may be covered by the reflective electrode layer.

In some exemplary embodiments, the first conductivity type semiconductor layer may include a nitride-based substrate having a non-polar or semi-polar growth plane.

The nitride-based substrate may be undoped or doped to exhibit the same conductivity type as the first conductivity type semiconductor layer.

The nitride-based substrate may have a thickness of 270 μm to 330 μm.

Contact resistance between the second conductivity type semiconductor layer and the conductive oxide may be lower than the contact resistance between the second conductivity type semiconductor layer and the reflective metal layer.

The light emitting structure may include a plurality of mesas including the second conductivity type semiconductor layer and the active layer, the second contact electrode may be disposed on the plurality of mesas, and the first conductivity type semiconductor layer may be exposed in at least some regions around the plurality of mesas.

The insulation layer may include a first insulation layer and a second insulation layer, and the first insulation layer may cover the plurality of mesas and the first conductivity type semiconductor layer and may include a first opening and a second opening partially exposing the first conductivity type semiconductor layer and the second contact electrode, respectively.

The first contact electrode may be in ohmic contact with the first conductivity type semiconductor layer through the first opening, and may be disposed on part of upper surfaces of the plurality of mesas and on side surfaces of the plurality of mesas and is insulated from the plurality of mesas.

The second insulation layer may partially cover the first contact electrode and may include a third opening and a fourth opening at least partially exposing the first contact electrode and the second contact electrode, respectively.

The light emitting device may further include: a first pad electrode disposed on the second insulation layer and electrically connected to the first contact electrode through the third opening; and a second pad electrode disposed on the second insulation layer and electrically connected to the second contact electrode through the fourth opening.

The insulation layer may cover the plurality of mesas and the first conductivity type semiconductor layer, and may include a first opening and a second opening partially exposing the first conductivity type semiconductor layer and the second contact electrode, respectively.

The first contact electrode may be in ohmic contact with the first conductivity type semiconductor layer through the first opening, and may be disposed on part of upper surfaces of the plurality of mesas and on side surfaces of the plurality of mesas and may be insulated from the plurality of mesas.

The light emitting device may further include a pad electrode disposed on the insulation layer and electrically connected to the second contact electrode through the second opening, wherein the pad electrode may be separated from the first contact electrode.

The light emitting structure may include a first region including one side of the light emitting structure and a second region including the other side thereof opposite to the one side of the light emitting structure, and the first contact electrode may be disposed in the first region and the pad electrode may be disposed in the second region.

In some exemplary embodiments, the first contact electrode may be disposed on at least part of the exposed region of the first conductivity type semiconductor layer.

The insulation layer may cover the plurality of mesas and the first conductivity type semiconductor layer and may include a first opening and a second opening partially exposing the first contact electrode and the second contact electrode, respectively.

The light emitting device may further include: a first pad electrode disposed on the insulation layer and electrically connected to the first contact electrode through the first opening; and a second pad electrode disposed on the insulation layer and electrically connected to the second contact electrode through the second opening, wherein the first pad electrode is disposed on part of upper surfaces of the plurality of mesas and on part of side surfaces of the plurality of mesas and is separated from the plurality of mesas by the insulation layer.

The light emitting structure may include a region where the first conductivity type semiconductor layer is partially exposed, and the insulation layer may include a first insulation layer. The first insulation layer may partially cover the light emitting structure and the second contact electrode and may include a first opening and a second opening partially exposing the first conductivity type semiconductor layer and the second contact electrode, respectively.

The first insulation layer may include a pre-insulation layer and a main insulation layer disposed on the pre-insulation layer, and the pre-insulation layer may partially cover the light emitting structure and the conductive oxide.

The pre-insulation layer may include an opening partially exposing the conductive oxide and the reflective electrode layer may be disposed inside the opening.

The main insulation layer may partially cover the reflective electrode layer.

The insulation layer may further include a second insulation layer disposed on the first insulation layer and partially covering the first contact electrode, and the first insulation layer may be thicker than the second insulation layer.

In some exemplary embodiments, the light emitting structure may include a first surface corresponding to one surface of the first conductivity type semiconductor layer and a second surface corresponding to one surface of the second conductivity type semiconductor layer, and the first surface of the light emitting structure may include a roughened surface having a plurality of protrusions. Here, each of the protrusions may include at least three side surfaces inclined at different angles with respect to the first surface.

Each of the protrusions may include first to third side surfaces, in which an angle defined between the first side surface and the first surface is greater than an angle defined between the second side and the first surface, and an angle defined between the third side surface and the first surface is greater than an angle defined between the first side surface and the first surface.

The first side surface may be interposed between the second side surface and the third side surface.

The protrusions may have a pentagonal shape in a horizontal cross-sectional view.

Each of the protrusions may have two first side surfaces, two second side surfaces, and one third side surface.

The two first side surfaces may be separated from each other and the two second side surfaces may be disposed adjacent to each other.

The light emitting structure may have an m-plane as a growth plane.

A side surface of each protrusion may include a curved surface.

The protrusions may have a height of 3 μm or more.

An area of a portion of the first surface occupied by the protrusions may be 80% or more of the total area of the first surface.

At least some protrusions may adjoin each other.

Each of the at least three side surfaces may have an inclination of 40 degrees or more with respect to the first surface.

The first surface of the light emitting structure may further include sub-protrusions formed thereon.

The sub-protrusions may have a nanometer scale.

The side surfaces of each protrusion may include at least one crystal plane.

The first conductivity type semiconductor layer may include a nitride-based substrate having a non-polar or semi-polar growth plane, and the first surface may be one surface of the nitride-based substrate.

The second contact electrode may be disposed on the second surface, and the second contact electrode may include a conductive oxide layer in ohmic contact with the second conductivity type semiconductor layer and a reflective electrode layer disposed on the conductive oxide layer.

The conductive oxide layer may include ITO and the reflective electrode layer may include Ag.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

FIG. 1A is a sectional view of a light emitting device according to one exemplary embodiment of the present invention. FIG. 2 is a plan view of the light emitting device according to the exemplary embodiment of the present invention, and FIG. 3A and FIG. 3B are a plan view and sectional views illustrating protrusions on a surface of the light emitting device according to the exemplary embodiment of the present invention.

First, referring to FIG. 1A, the light emitting device according to the exemplary embodiment includes a light emitting structure 120, a first contact electrode 130, and a second contact electrode 140. The light emitting device may further include a connection electrode 145, insulation layers 150, 160, a first pad electrode 171, and a second pad electrode 173.

The light emitting structure 120 may include a first conductivity type semiconductor layer 121, an active layer 123 disposed on the first conductivity type semiconductor layer 121, and a second conductivity type semiconductor layer 125 disposed on the active layer 123. The first conductivity type semiconductor layer 121 may include a growth substrate 121a and an upper first conductivity type semiconductor layer 121b disposed on the growth substrate 121a. The light emitting structure 120 may include a first surface and a second surface opposite to the first surface. In this exemplary embodiment, a surface corresponding to one surface of the first conductivity type semiconductor layer 121, that is, a lower surface 210 of the light emitting structure 120, is defined as the first surface. Likewise, a surface corresponding to one surface of the second conductivity type semiconductor layer 125, that is, an upper surface of the light emitting structure 120, is defined as the second surface.

Each of the first conductivity type semiconductor layer 121, the active layer 123 and the second conductivity type semiconductor layer 125 may include a group III-V based compound semiconductor, for example, a nitride-based semiconductor, such as (Al, Ga, In)N. The first conductivity type semiconductor layer 121 may include n-type dopants (for example, Si) and the second conductivity type semiconductor layer 125 may include p-type dopants (for example, Mg). Particularly, the upper first conductivity type semiconductor layer 121b of the first conductivity type semiconductor layer 121 may include intentionally doped n-type dopants to exhibit n-type conductivity. Alternatively, each of the first and second conductivity type semiconductor layers 121, 125 may exhibit conductivity opposite to the aforementioned conductivity thereof. The active layer 123 may include a multi-quantum well (MQW) structure.

As the growth substrate 121a, any substrate capable of growing nitride-based semiconductor layers thereon may be used without limitation. For example, the growth substrate 121a may include a heterogeneous substrate, such as a sapphire substrate, a silicon substrate, a silicon carbide substrate, and a spinel substrate, or a homogeneous substrate, such as a gallium nitride substrate or an aluminum nitride substrate. Particularly, in this exemplary embodiment, the growth substrate 121a may be a homogenous substrate, such as a gallium nitride substrate, which is formed of the same kind of material as that of the upper first conductivity type semiconductor layer 121b. When the growth substrate 121a is a nitride-based substrate, the growth substrate 121a may include a single crystal nitride-based semiconductor. The growth substrate 121a may be doped with n-type dopants to exhibit n-type conductivity, or may be undoped. However, since the nitride-based semiconductor exhibits n-type conductivity due to inherent defects such as nitrogen vacancies even in an undoped state, the undoped growth substrate 121a also exhibits n-type conductivity. Accordingly, the undoped growth substrate 121a may have the same conductivity type as the upper first conductivity type semiconductor layer 121b doped with the n-type dopants.

Semiconductor layers of the light emitting structure 120 may be grown on the growth substrate 121a. Accordingly, as described below, the semiconductor layers of the light emitting structure 120 may have the same growth planes. The growth substrate 121a may be separated and/or removed from the upper first conductivity type semiconductor layer 121b after growth of the upper first conductivity type semiconductor layer 121b, the active layer 123 and the second conductivity type semiconductor layer 125.

The light emitting structure 120 has a non-polar or semi-polar growth plane. Thus, each of the first conductivity type semiconductor layer 121, the active layer 123 and the second conductivity type semiconductor layer 125 may also have a non-polar or semi-polar growth plane. Particularly, an upper surface of the second conductivity type semiconductor layer 125 includes a non-polar or semi-polar growth plane. In this structure, separation between energy bands is reduced upon coupling between electrons and holes within the light emitting structure 120. Specifically, the growth planes of the semiconductor layers of the light emitting structure 120 may be non-polar planes, such as the a-plane or the m-plane, or semi-polar planes (for example, {20-2-1} or {30-3-1}). Such a non-polar or semi-polar growth plane of the semiconductor layers of the light emitting structure 120 may be realized by growing the upper first conductivity type semiconductor layer 121b, the active layer 123 and the second conductivity type semiconductor layer 125 on the growth substrate 121a having a non-polar or semi-polar growth plane.

Further, an upper surface of the growth substrate 121a, that is, a growth plane of the growth substrate 121a, may have a predetermined off-cut angle. For example, when the growth plane of the growth substrate 121a is the m-plane, the upper surface of the growth plane may have a predetermined off-cut angle in the c-direction (<0001> family of directions) and/or in the a-direction (<11-20> family of directions) with reference to the m-plane. Here, the c-direction and the a-direction are normal to the c-plane and the a-plane, respectively. The off-cut angle may range, for example, from −10° to +10°, without being limited thereto. The growth plane having an off-cut angle may also be a non-polar or semi-polar plane. A fine step is formed on the surface of the growth plane (for example, the m-plane) having an off-cut angle and another crystal plane (for example, the c-plane) may be exposed to a side surface of the step. Upon growth of nitride semiconductors on such a growth substrate 121a through vapor deposition, high coupling energy on the surface of the step promotes growth of the semiconductor layers. Accordingly, it is possible to increase a growth rate of nitride semiconductor layers through adjustment of the off-cut angle on the surface of the growth substrate 121a.

Herein, the term "particular growth plane" includes the case where a predetermined off-cut angle is formed from the particular growth plane.

The growth substrate 121a may have a thickness T greater than or equal to a predetermined thickness. The growth substrate 121a may have a thickness T of about 100 μm or more, for example, about 200 μm to 500 μm, specifically about 270 μm to about 330 μm. Within this thickness range of the growth substrate 121a, the light emitting device can have improved luminous efficacy. Further, in the structure wherein the growth substrate 121a is a gallium nitride substrate, the growth substrate 121a has a thickness T of a predetermined value or more in order to reduce junction temperature $T_j$ of the light emitting device through improvement in heat dissipation and heat distribution efficiency. As a result, the light emitting device has improved luminous power and reliability.

Although the light emitting structure 120 is illustrated as including a non-polar or semi-polar homogeneous nitride-based substrate or as being grown on the non-polar or semi-polar homogeneous nitride-based substrate in this exemplary embodiment, it should be understood that other implementations are possible. Other types of substrates may also be applied to exemplary embodiments of the present disclosure without being limited to the homogeneous substrate so long as the substrate allows growth of the light emitting structure 120 thereon such that the light emitting structure 120 has a semi-polar or non-polar growth plane. Furthermore, if a heterogeneous substrate is used as the growth substrate, the growth substrate may be separated and removed from the light emitting structure 120 after completion of growth of the light emitting structure 120. Here, even in the case where the growth substrate is separated from the light emitting structure 120, the first conductivity type semiconductor layer 121 grown on the heterogeneous substrate may have a thickness greater than or equal to the thickness T of the growth substrate 121a, thereby similarly realizing the effect of increasing luminous power in proportion to the thickness of the growth substrate 121a.

Referring to FIG. 1A again, the light emitting structure 120 may include a partially exposed region of an upper surface of the first conductivity type semiconductor layer 121. The partially exposed region of the upper surface of the first conductivity type semiconductor layer 121 may be formed by partially removing the second conductivity type semiconductor layer 125 and the active layer 123. As shown therein, the upper surface of the first conductivity type semiconductor layer 121 may be partially exposed through a hole formed through the second conductivity type semiconductor layer 125 and the active layer 123. The hole may have an inclined side surface. The hole may be provided in plural and it should be understood that the shape and arrangement of holes are not limited to the structure shown in FIG. 1A. In addition, the partially exposed region of the first conductivity type semiconductor layer 121 may be provided by partially removing the second conductivity type semiconductor layer 125 and the active layer 123 so as to form a mesa including the second conductivity type semiconductor layer 125 and the active layer 123.

Further, the light emitting structure 120 may further include a roughened surface formed by increasing roughness of the light emitting structure. In this exemplary embodiment, the roughened surface of the light emitting structure 120 may be the first surface of the light emitting structure 120, that is, the lower surface 210 of the light emitting structure 120. Thus, the first surface corresponds to one surface of the first conductivity type semiconductor layer 121. Next, the roughened surface included in the first surface of the light emitting structure 120 will be described with reference to FIG. 2 to FIG. 4.

Referring to FIG. 1A and FIG. 2, the light emitting structure 120 includes the lower surface 210 having improved roughness. The lower surface 210 of the light emitting structure 120 includes protrusions 211 and depressions 212 disposed around each protrusion 211.

The lower surface 210 of the light emitting structure 120 may include a plurality of protrusions 211, which may be arranged in a regular pattern, as shown in the drawings. In addition, the protrusions 211 may be separated from each other. Alternatively, at least some protrusions 211 may adjoin each other. Each of the protrusions 211 may include side surfaces inclined at different angles with respect to the lower surface 210 of the light emitting structure 120, that is, the first surface of the light emitting structure 120. Specifically, the protrusion 211 may include at least three side surfaces inclined at different angles with respect to the lower surface 210 of the light emitting structure 120. Here, the side surfaces of the protrusion 211 may include at least one crystal plane. It should be noted that, among the side surfaces of the protrusion 211, the entirety of one side surface may not be necessarily composed of the same crystal plane. Thus, at least one of the side surfaces of the protrusion 211 may include a curved surface, and an edge at which the side surfaces of the protrusion 211 adjoin each other may be formed to have a curvature.

The protrusions 211 may have various horizontal cross-sectional shapes. The protrusions 211 may have a polygonal shape in horizontal cross-sectional view. Here, the polygonal shape may not be a regular polygonal shape. Further, an angle defined between a side surface of each of the protrusions 211 and the lower surface 210 of the light emitting structure 120 may be about 40° or more, and the protrusions 211 may have a height of about 3 µm or more.

The protrusions 211 may be formed by dry etching. In addition, the protrusions 211 may be formed by dry etching using $SiO_2$ as an etching mask. By way of example, $SiO_2$ is formed on the lower surface 210 of the light emitting structure 120 by PECVD and is subjected to patterning through photolithography to form an etching mask, which in turn is used to form the protrusions 211 through partial dry etching of the light emitting structure 120. Alternatively, a patterned photo-mask is formed on the light emitting structure 120, and $SiO_2$ is formed to cover the photo-mask and the lower surface 210 of the light emitting structure 120 and is subjected to patterning by lifting-off the photo-mask. Then, the protrusions 211 may be formed by partially dry etching the light emitting structure using the patterned $SiO_2$ film as an etching mask. These methods are different in terms of the method of forming an etching mask and the etching mask has a different shape depending upon the method of forming an etching mask. Although the shape of the protrusions 211 may differ depending upon the shape of the etching mask, it should be understood that the present disclosure is not limited to a particular method.

When $SiO_2$ is used as the etching mask as in the exemplary embodiments, light extraction efficiency of the light emitting device can be further improved as compared with the case where photoresist is used as the etching mask. For example, when comparing a light emitting device manufactured using a photoresist mask with a light emitting device manufactured using an $SiO_2$ mask including a masking portion and an opening, which are the same as those of the photoresist mask, light output of the light emitting device manufactured using the $SiO_2$ mask is 20% higher than that of the light emitting device manufactured using the photoresist mask.

Dry etching may include reactive dry etching. For example, reactive dry etching may include inductively coupled plasma reactive-ion dry etching (ICP-RIE) using $BCl_3$ and $Cl_2$ gas. Upon reactive dry etching with respect to the lower surface 210 of the light emitting structure 120, a portion of the first conductivity type semiconductor layer 121 exposed through the opening of the etching mask is etched. Here, since chemical reaction also occurs during dry etching, the protrusion 211 may include at least three side surfaces. The at least three side surfaces may not correspond to the shape of the opening of the etching mask. For example, when the opening of the etching mask has a circular shape, the protrusions 211 may be formed in a polygonal shape having a plurality of side surfaces in horizontal cross-sectional view. The three side surfaces formed by such chemical reaction may have certain orientations, which can be determined depending upon a crystal plane of a semiconductor layer. Thus, according to exemplary embodiments, the side surfaces of the protrusion 211 may include at least one crystal plane. It should be noted that the entirety of one side surface of the protrusion may not be composed of one crystal plane and the side surface of the protrusion 211 may include a plane formed in some regions thereof and having a curvature. Furthermore, the protrusions 211 may be formed to have a curvature at an edge thereof where side surfaces of the protrusions adjoin each other.

The shape of the protrusions 211 may differ depending upon the method of manufacturing an etching mask, the shape of the etching mask, conditions for dry etching, and the like. Particularly, when the protrusions 211 are formed by inductively coupled plasma reactive-ion dry etching (ICP-RIE), the shape of the protrusions 211 differs depending upon the crystal plane of the lower surface 210 of the light emitting structure 120.

For example, as shown in FIG. 3A to FIG. 3C, protrusions 211 each including first to third side surfaces 211a, 211b, 211c may be formed on the lower surface 210 of the light emitting structure 120, which is the m-plane. Hereinafter, the protrusion 211 will be described in more detail with reference to FIG. 3A to FIG. 3C. FIG. 3A is an enlarged plan view of the protrusion 211, FIG. 3B is a cross-sectional view taken along line A-C-A' of FIG. 3A and FIG. 3C is a cross-sectional view taken along line B-C-B' of FIG. 3A. It should be understood that the protrusion described with reference to FIG. 3A to FIG. 3C is illustrated by way of example and other implementations are also possible.

Referring to FIG. 3A to FIG. 3C, the protrusion 211 includes the first to third side surfaces 211a, 211b, 211c inclined at different angles with respect to the lower surface 210 of the light emitting structure 120. The protrusion 211 may further include an upper surface 211d. Angles defined between the first to third side surfaces 211a, 211b, 211c and the lower surface 210 of the light emitting structure 120 may be defined as first to third angles α, β, γ, respectively. The first angle α is greater than the second angle β and the third angle γ is greater than the first angle α. The first side surface 211a is interposed between the second and third side surfaces 211b, 211c. The first to third angles α, β, γ may be about 40° or more, which allows emitted light to reach the surface of the light emitting device at an angle greater than or equal to a critical angle at which total internal reflection of the light occurs, thereby improving light extraction efficiency of the light emitting device. Further, the protrusion 211 may have a height H of, for example, about 2 μm or more, specifically 2 μm to 4.5 μm. The protrusions 211 having a height H of about 2 μm or more can improve light extraction efficiency.

The protrusions 211 may have various horizontal cross-sectional shapes. For example, the protrusions 211 may have a substantially pentagonal shape in horizontal cross-sectional view. In this example, each protrusion 211 may be composed of two first side surfaces 211a, two second side surfaces 211b, and one third side surface 211c. The two first side surfaces 211a may be separated from each other and the two second side surfaces 211b may be adjacent to each other. For example, such protrusions 211 may be formed on the lower surface 210 of the light emitting structure 120, which is the m-plane. However, it should be understood that the shape of the protrusions 211 is not limited to the structure wherein the lower surface 210 of the light emitting structure 120 is the m-plane. When formed on the lower surface 210 of the light emitting structure 120 which is not the m-plane or exhibit non-polar or semi-polar characteristics, the protrusions 211 may have the shape as described above or may have s different shape from the shape described above.

The protrusion 211 may further include a substantially flat upper surface 211d. The upper surface 211d of the protrusion 211 may be parallel to a lower surface thereof. Alternatively, the upper surface 211d of the protrusion 211 may be a convex surface. Alternatively, the protrusion 211 may be formed in a poly-pyramidal shape without having an envisioned (for example, micrometer scale) upper surface.

In addition, the protrusions 211 may be formed to occupy a certain area ratio or more with respect to the total area of the lower surface 210 of the light emitting structure 120. As shown in FIG. 4, an area 211AR occupied by the protrusions 211 may be 80% or more an area 210AR of the lower surface 210 of the light emitting structure. With the protrusions 211 formed to occupy the area 211AR within this range on the lower surface 210 of the light emitting structure, the light emitting device can have further improved light extraction efficiency.

Conventionally, dry etching and/or wet etching has been used as a method for increasing surface roughness of a nitride-based semiconductor layer. For example, a process of forming a surface pattern having a micrometer scale through dry etching and then forming fine bumps and depressions having a smaller scale through wet etching has been used. However, such a conventional surface treatment technique can be applied to a semiconductor layer having high dislocation density and grown on the c-plane such that the surface of the semiconductor layer becomes a Ga-face or an N-face. That is, wet etching can be applied to a semiconductor layer having a number of defects on the surface thereof or a semiconductor layer in which coupling between surface atoms can be easily released by an etchant. Since the light emitting device according to the exemplary embodiments includes the light emitting structure 120 having a non-polar or semi-polar growth plane, the light emitting structure 120 has a relatively low dislocation density and the surface of the light emitting structure 120 also exhibits non-polarity or semi-polarity, thereby making it more difficult to release coupling between surface atoms than a surface having polarity. Thus, even when typical surface treatment is applied to the light emitting device according to the exemplary embodiments, it is unlikely that the light emitting device has fine roughness, thereby making it difficult to increase light extraction efficiency. Further, since the growth direction of the light emitting structure 120 is different from that of a conventional technique, surface roughness formed on the light emitting structure 120 by the conventional technique has a different critical angle from surface roughness formed on the light emitting structure according to the exemplary embodiments, thereby providing insufficient light extraction efficiency.

Conversely, according to the exemplary embodiments, since the surface of the light emitting structure 120 having a non-polar or semi-polar growth plane is subjected to patterning by reactive dry etching, it is possible to realize the light emitting structure 120 including the protrusions 211 having a micrometer scale. Thus, it is possible to form a roughness structure capable of improving light extraction efficiency with respect to the surface of the light emitting structure having non-polar or semi-polar characteristics. In particular, according to the exemplary embodiments, the protrusions 211 having a size, side angle and height capable of improving light extraction efficiency can be realized, thereby providing surface morphology having superior light extraction efficiency to surface morphology obtained by a typical method.

In other exemplary embodiments, the first surface of the light emitting structure 120, that is, the lower surface 210 of the light emitting structure 120, may further include sub-protrusions 211S formed thereon. As shown in FIGS. 5 (a) and (b), the sub-protrusions 211A may be formed on the upper and side surfaces of the protrusion 211. Furthermore, the sub-protrusions 211A may be formed on a surface of the depression 212. The sub-protrusions 211A may have a smaller scale than the protrusions 211. For example, the sub-protrusions 211A may have a nanometer scale. Light is scattered by the sub-protrusions 211A, thereby further improving light extraction efficiency of the light emitting device.

The sub-protrusions 211A may be formed by dry etching. For example, a metal thin film of Ni, Au, or the like is formed on the lower surface 210 of the light emitting structure 120 having the protrusions 211 thereon by e-beam deposition or the like. Then, a plurality of metal particles is formed through agglomeration of the metal thin film by heat treatment using a laser beam. Here, the metal particles may have a size of nanometer scale. The sub-protrusions 211A may be formed by dry etching the lower surface 210 of the light emitting structure 120 using the metal particles as an etching mask. It should be understood that other implementations are possible.

Referring to FIG. 1A again, the second contact electrode 140 is disposed on the second conductivity type semiconductor layer 125 and forms ohmic contact with the second conductivity type semiconductor layer 125. The second contact electrode 140 includes a conductive oxide layer 141 and a reflective electrode layer 143 disposed on the conductive oxide layer 141. The conductive oxide layer 141 may contact the second conductivity type semiconductor layer 125. That is, the conductive oxide layer 141 may form ohmic contact with the second conductivity type semiconductor layer 125 having a non-polar or semi-polar growth plane. The reflective electrode layer 143 is disposed on the conductive oxide layer 141 and may have a smaller area than the conductive oxide layer 141. Accordingly, the reflective electrode layer 143 may be disposed within an outer peripheral region of the conductive oxide layer 141.

The conductive oxide layer 141 may include ITO, IZO, IZTO, IAZO, IGZO, IGTO, AZO, $IrO_x$, $RuO_x$, $RuO_x$/ITO, MgO, ZnO, and the like. Particularly, the conductive oxide layer 141 may be formed of ITO. Here, contact resistance between the conductive oxide layer 141 and the second conductivity type semiconductor layer 125 may be lower than contact resistance between a metal (for example, Ag) and the second conductivity type semiconductor layer 125. Although the conductive oxide layer 141 may have any thickness without limitation, the thickness of the conductive oxide layer 141 may be optimally determined so as to provide low contact resistance between the second contact electrode 140 and the second conductivity type semiconductor layer 125 without significantly deteriorating luminous efficacy of the light emitting device. For example, the conductive oxide layer 141 may have a thickness of about 50 Å to 400 Å. Particularly, the conductive oxide layer 141 may be formed of ITO having a thickness of 50 Å to 150 Å. However, it should be understood that other implementations are also possible.

The reflective electrode layer 143 may include a metallic material exhibiting high reflectivity with respect to light. The metallic material may be selected in various ways depending upon wavelengths of light emitted from the light emitting device. The reflective electrode layer 143 may include a reflective layer and a cover layer covering the reflective layer. For example, the reflective layer may include at least one selected from among Ni, Pt, Pd, Rh, W, Ti, Al, Mg, Ag and Au. The reflective layer may be formed by sputtering, e-beam evaporation, and the like. For example, upon formation of the reflective layer by sputtering, the reflective layer may be formed to have a gradually decreasing thickness from an outer peripheral region to an inner peripheral region. The reflective layer may be composed of a single layer or multiple layers. The cover layer can prevent interdiffusion of materials between the reflective layer and other layers and can prevent external materials from diffusing into and damaging the reflective layer. The cover layer may include, for example, Au, Ni, Ti, Cr, and the like, and may be composed of a single layer or multiple layers.

The second conductivity type semiconductor layer 125 has a non-polar or semi-polar growth plane, and a p-type nitride-based semiconductor layer having a non-polar or semi-polar growth plane is unlikely to form ohmic contact with a metallic material or has high contact resistance even in the case of forming ohmic contact therewith. According to this exemplary embodiment, the second contact electrode 140 includes the conductive oxide layer 141 contacting the second conductivity type semiconductor layer 125 and thus can form ohmic contact of low contact resistance with the second conductivity type semiconductor layer 125 having the non-polar or semi-polar growth plane. In addition, since the reflective electrode layer 143 is not required to form direct ohmic contact with the second conductivity type semiconductor layer 125, an annealing process for allowing the reflective electrode layer 143 to form ohmic contact with the second conductivity type semiconductor layer 125 can be omitted. Thus, it is possible to prevent deterioration in reflectivity due to damage to the reflective electrode layer 143 during annealing.

Further, the second contact electrode 140 may at least partially cover an upper surface of the second conductivity type semiconductor layer 125, or may cover the overall upper surface of the second conductivity type semiconductor layer 125. Alternatively, the second contact electrode 140 may be formed in a monolithic structure so as to cover the upper surface of the second conductivity type semiconductor layer 125 in a remaining region excluding a region corresponding to the exposed region of the first conductivity type semiconductor layer 121 of the light emitting structure 120. With this structure, the second contact electrode 140 can uniformly supply electric current to the entirety of the light emitting structure 120, thereby improving current spreading efficiency. It should be understood that other implementations are also possible and the second contact electrode 140 may include a plurality of unit electrodes.

Particularly, the conductive oxide layer 141 of the second contact electrode 140 may cover substantially the entirety of the upper surface of the second conductivity type semiconductor layer 125. For example, the conductive oxide layer 141 may cover 90% or more of the upper surface of the second conductivity type semiconductor layer 125. After formation of the light emitting structure 120, the conductive oxide layer 141 may be formed over the entire upper surface of the light emitting structure 120 and then subjected to etching together with the second conductivity type semiconductor layer 125 and the active layer 123 during an etching process in which the first conductivity type semiconductor layer 121 is exposed. On the other hand, when a contact electrode of a metallic material is formed on the second conductivity type semiconductor layer 125 through deposition or plating, the contact electrode can be placed within a region separated a predetermined distance from the outer periphery of the upper surface of the second conductivity type semiconductor layer 125 due to process margin of a mask. Thus, if the conductive oxide layer 141 is formed as a portion in ohmic contact with the second contact electrode 140, the distance from the contact electrode to the outer periphery of the upper surface of the second conductivity type semiconductor layer 125 can be reduced, as compared with the case where the contact electrode is formed of a metallic material. A contact area between the second conductivity type semiconductor layer 125 and the second contact electrode 140 can be relatively increased, thereby reducing forward voltage $V_f$ of the light emitting device. In addition, since the conductive oxide layer 141 can be placed closer to the periphery of the second conductivity type semiconductor layer 125 than the metallic material, the shortest distance from a portion at which the second contact electrode 140 contacts the second conductivity type semiconductor layer 125 to a portion at which the first contact electrode 130 contacts the first conductivity type semiconductor layer 121 can also be decreased, thereby further reducing forward voltage $V_f$ of the light emitting device.

It should be understood that other implementations are also possible. Alternatively, as shown in FIG. 1B, a reflective electrode layer 143' may be formed to cover a side surface of a conductive oxide layer 141'. The light emitting device of FIG. 1B is generally the same as the light emitting device of FIG. 1A excluding the structure of the second contact electrode 140, and a detailed description thereof will thus be omitted.

Referring to FIG. 1A again, the insulation layers 150, 160 insulate the first contact electrode 130 and the second contact electrode 140 from each other. The insulation layers 150, 160 are disposed on the light emitting structure 120 and may partially cover the first and second contact electrodes 130, 140. The insulation layers 150, 160 may include a first insulation layer 150 and a second insulation layer 160. Hereinafter, the first insulation layer 150 will be described first and the second insulation layer 160 will be described below.

The first insulation layer 150 may partially cover the upper surface of the light emitting structure 120 and the second contact electrode 140. Further, the first insulation layer 150 may cover a side surface of the hole which partially exposes the first conductivity type semiconductor layer 121, while at least partially exposing the first conductivity type semiconductor layer 121 exposed through the hole. The first insulation layer 150 may include an opening formed at a location corresponding to the hole and an opening that exposes a portion of the second contact electrode 140. The first conductivity type semiconductor layer 121 and the second contact electrode 140 can be partially exposed through the openings. Particularly, a portion of the reflective electrode layer 143 of the second contact electrode 140 can be exposed.

The first insulation layer 150 may include an insulating material, for example, $SiO_2$, $SiN_x$, $MgF_2$, and the like. The first insulation layer 150 may include multiple layers and may include a distributed Bragg reflector in which materials having different indices of refraction are alternately stacked one above another.

In other exemplary embodiments, the first insulation layer 150 may further cover a side surface of at least part of the light emitting structure 120. A coverage rate of the first insulation layer 150 on the side surface of the light emitting structure 120 may differ depending upon isolation into unit chips in fabrication of the light emitting device. That is, as in the above exemplary embodiment, the first insulation layer 150 may cover only the upper surface of the light emitting structure 120. Alternatively, when the first insulation layer 150 is formed after isolation of the wafer into unit chips in fabrication of the light emitting device, the first insulation layer 150 may also cover not only the upper surface of the light emitting structure 120 but also the side surface of the light emitting structure 120.

The first insulation layer 150 may include a pre-insulation layer 150a and a main insulation layer 150b. In formation of the first insulation layer 150, the pre-insulation layer 150a may be formed prior to the main insulation layer 150b, whereby the pre-insulation layer 150a can be placed at a lower portion of the first insulation layer 150.

Specifically, the pre-insulation layer 150a may cover a portion of the light emitting structure 120, and may also cover a portion of an upper surface of the second contact electrode 140 and a side surface of the second contact electrode 140. In this exemplary embodiment, the pre-insulation layer 150a may cover a side surface and a portion of an upper surface of the conductive oxide layer 141 of the second contact electrode 140, and includes an opening that partially exposes the conductive oxide layer 141. The reflective electrode layer 143 may be formed on the conductive oxide layer 141 exposed through the opening. In this exemplary embodiment, the reflective electrode layer 143 is separated from the pre-insulation layer 150a so as not to contact each other. Alternatively, the pre-insulation layer 150a may contact the reflective electrode layer 143 according to a process of forming the reflective electrode layer 143. The main insulation layer 150b is formed on the pre-insulation layer 150a and partially covers the reflective electrode layer 143. In a structure wherein the reflective electrode layer 143 does not adjoin the pre-insulation layer 150a, the pre-insulation layer 150a is not interposed between the reflective electrode layer 143 and the main insulation layer 150b.

The pre-insulation layer 150a and the main insulation layer 150b may be formed of the same material, and may include, for example, $SiO_2$. The pre-insulation layer 150a may have a greater thickness than the conductive oxide layer 141.

The pre-insulation layer 150a may be formed during formation of the second contact electrode 140. For example, with the conductive oxide layer 141 formed on the second conductivity type semiconductor layer 125, the pre-insulation layer 150a is formed before formation of the reflective electrode layer 143. In this exemplary embodiment, the pre-insulation layer 150a may be formed to a thickness of about 1,000 Å. The pre-insulation layer 150a may be formed to cover the side surface of the hole which exposes the first conductivity type semiconductor layer 121, and a portion of the conductive oxide layer 141. Here, the pre-insulation layer 150a partially covers conductive oxide layer 141 excluding a region of the conductive oxide layer 141, in which a second contact electrode 143 will be formed, such that the opening partially exposing the conductive oxide layer 141 is formed. Thereafter, the reflective electrode layer 143 is formed on the opening through which the conductive oxide layer 141 is exposed. The reflective electrode layer 143 may be separated from or bonded to the pre-insulation layer 150a. In this way, the pre-insulation layer 150a is formed prior to the reflective electrode layer 143, thereby preventing reflectivity reduction and resistance increase of the reflective electrode layer 143 caused by interdiffusion of materials between the reflective electrode layer 143 and the light emitting structure 120. After the reflective electrode layer 143 is formed on the conductive oxide layer 141, the main insulation layer 150b is formed on the pre-insulation layer 150a so as to partially cover the reflective electrode layer 143, thereby forming the first insulation layer 150.

As in the exemplary embodiment of FIG. 1B wherein the reflective electrode layer 143' is formed to cover the conductive oxide layer 141', the pre-insulation layer 150a may be formed only on the light emitting structure 120 instead of partially covering the conductive oxide layer 141'.

The first contact electrode 130 may partially cover the light emitting structure 120. In addition, the first contact electrode 130 forms ohmic contact with the first conductivity type semiconductor layer 121 through the partially exposed surface of the first conductivity type semiconductor layer 121. As in this exemplary embodiment, in the structure wherein the exposed region of the first conductivity type semiconductor layer 121 is formed in a hole shape, the first contact electrode 130 forms ohmic contact with the first conductivity type semiconductor layer 121 through the opening of the first insulation layer 150 placed corresponding to the hole. Further, the first contact electrode 130 may be formed to cover the entire upper surface of the first insulation layer 150 excluding some regions thereof. In this structure, light can be reflected by the first contact electrode 130. Further, the first contact electrode 130 is spaced apart from the second contact electrode 140 via the first insulation layer 150 so as to be electrically insulated therefrom.

With the structure wherein the first contact electrode 130 is formed to cover the entire upper surface of the light emitting structure 120 excluding some regions thereof, the light emitting device can have further improved current spreading efficiency. Further, a portion of the light emitting structure not covered by the second contact electrode 140 can be covered by the first contact electrode 130, thereby improving luminous efficacy of the light emitting device through more effective reflection of light.

As described above, the first contact electrode 130 can form ohmic contact with the first conductivity type semiconductor layer 121 while reflecting light. Thus, the first contact electrode 130 may include a highly reflective metal layer such as an Al layer. The first contact electrode 130 may be composed of a single layer or multiple layers. The highly reflective metal layer may be formed on a bonding layer such as a Ti layer, a Cr layer or a Ni layer. It should be understood that other implementations are also possible and the first contact electrode 130 may include at least one of Ni, Pt, Pd, Rh, W, Ti, Al, Mg, Ag and Au.

In other exemplary embodiments, the first contact electrode 130 may be formed to cover a side surface of the light emitting structure 120 as well as the upper surface thereof. In the structure wherein the first contact electrode 130 also covers the side surface of the light emitting structure 120, the first contact electrode 130 reflects light emitted through the side surface of the active layer 123 in an upward direction, thereby increasing the ratio of light emitted through the upper surface of the light emitting device. In the structure wherein the first contact electrode 130 covers the side surface of the light emitting structure 120 as well as the upper surface thereof, the first insulation layer 150 may be interposed between the side surface of the light emitting structure 120 and the first contact electrode 130.

The light emitting device may further include the connection electrode 145. The connection electrode 145 may be disposed on the second contact electrode 140 and may be electrically connected to the second contact electrode 140 through the opening of the first insulation layer 150. Further, the connection electrode 145 may electrically connect the second contact electrode 140 to the second pad electrode 173. Furthermore, the connection electrode 145 may be formed to partially cover the first insulation layer 150 and may be separated from the first contact electrode 130 to be insulated from each other. An upper surface of the connection electrode 145 may be generally flush with an upper surface of the first contact electrode 130. In addition, the connection electrode 145 may be formed by the same process as that of the first contact electrode 130, and the connection electrode 145 and the first contact electrode 130 may include the same materials. It should be understood that other implementations are also possible and the connection electrode 145 and the first contact electrode 130 may include different materials.

The second insulation layer 160 may partially cover the first contact electrode 130 and may include a first opening 160a that partially exposes the first contact electrode 130 and a second opening 160b that partially exposes the second contact electrode 140. Each of the first and second openings 160a, 160b may be provided in plural.

The second insulation layer 160 may include an insulating material, for example, $SiO_2$, $SiN_x$, and $MgF_2$. Furthermore, the second insulation layer 160 may be composed of multiple layers and may include a distributed Bragg reflector in which materials having different indices of refraction are stacked one above another. In the structure wherein the second insulation layer 160 is composed of multiple layers, the uppermost layer of the second insulation layer 160 may be formed of $SiN_x$. The structure wherein the uppermost layer of the second insulation layer 160 is formed of $SiN_x$ can more effectively prevent moisture penetration into the light emitting structure 120. Alternatively, the second insulation layer 160 may be composed of a single layer of $SiN_x$. With a structure wherein the first insulation layer 150 is formed of $SiO_2$ and the second insulation layer 160 is formed of $SiN_x$, the light emitting device can achieve improvement both in luminous efficacy and reliability. With the structure wherein the first insulation layer 150 formed of $SiO_2$ is formed under the first contact electrode 130, it is possible to maximize light refection efficiency of the light emitting device through the first contact electrode 130 and the second contact electrode 140 while efficiently protecting the light emitting device from external moisture using the second insulation layer 160 formed of $SiN_x$.

The first insulation layer 150 may have a greater thickness than the second insulation layer 160. The first insulation layer 150 is formed through two steps including formation of the pre-insulation layer 150a and thus can have a greater thickness than the second insulation layer 160. In this exemplary embodiment, the thickness of the main insulation layer 150b of the first insulation layer 150 may be substantially the same as the thickness of the second insulation layer 160, without being limited thereto.

The first and second pad electrodes 171, 173 are placed on the light emitting structure 120. The first and second pad electrodes 171, 173 may be electrically connected to the first and the second contact electrodes 130, 140 through the first and second openings 160a, 160b, respectively. An external power source may be supplied to the light emitting structure 120 through the first and second pad electrodes 171, 173.

The first and second pad electrodes 171, 173 may be formed together by the same process, for example, photolithography and etching technology or lift-off technology. Each of the first and second pad electrodes 171, 173 may be composed of a single layer or multiple layers, and may include, for example, a bonding layer such as a Ti layer, a Cr layer or a Ni layer, and a high conductivity metal layer such as an Al layer, a Cu layer, an Ag layer or an Au layer.

This exemplary embodiment provides a light emitting device that includes the light emitting structure 120 having a non-polar or semi-polar growth plane and the conductive oxide layer 141 in ohmic contact with the light emitting structure 120. With this structure, the light emitting device has high lateral current spreading efficiency upon high current operation, secures low contact resistance between contact electrodes and semiconductor layers so as to provide relatively low forward voltage $V_f$, and includes a nitride-based growth substrate having a predetermined thickness or more, thereby providing improved luminous power through improvement in current spreading efficiency and heat distribution efficiency. In addition, the protrusions 211 are formed on the lower surface 210 of the light emitting structure 120, which has a non-polar or semi-polar growth plane, thereby improving light extraction efficiency of the light emitting device.

FIG. 6 and FIG. 7 are plan views and a sectional view of a light emitting device according to a further exemplary embodiment of the present disclosure. In FIG. 6, (a) is a plan view of the light emitting device according to this exemplary embodiment and (b) is a plan view showing locations of mesas M and contact regions 120a in which the first conductivity type semiconductor layer 121 forms ohmic contact with the first contact electrode 130. FIG. 7 is a cross-sectional view taken along line A-A' of FIG. 6.

The light emitting device of FIG. 6 and FIG. 7 is different from the light emitting device of FIG. 1A in that the light emitting structure 120 includes a plurality of mesas M and exposed regions of the first conductivity type semiconductor layer 121 formed around the mesas M, and provides different arrangement of other components thereof depending upon the structure of the light emitting structure 120. The following description will focus on different features of the light emitting device according to this exemplary embodiment, and detailed description of the same components will be omitted.

First, referring to FIG. 6 and FIG. 7, the light emitting device according to this exemplary embodiment includes a light emitting structure 120, a first contact electrode 130, a second contact electrode 140, and insulation layers 150, 160. In addition, the light emitting device may further include a connection electrode 145, a first pad electrode 171, and a second pad electrode 173.

The light emitting structure 120 may include a first conductivity type semiconductor layer 121, an active layer 123 disposed on the first conductivity type semiconductor layer 121, and a second conductivity type semiconductor layer 125 disposed on the active layer 123. The first conductivity type semiconductor layer 121 may include a growth substrate 121a and an upper first conductivity type semiconductor layer 121b disposed on the growth substrate 121a. The growth substrate 121a may have a thickness T greater than or equal to a predetermined thickness. The growth substrate 121a may have a thickness T of about 100 μm or more, for example, about 200 μm to 500 μm, specifically about 270 μm to about 330 μm. Each of the semiconductor layers of the light emitting structure 120 has a non-polar or semi-polar growth plane. In addition, the light emitting structure 120 includes a lower surface 210 having improved roughness and including a plurality of protrusions 211 as described with reference to FIG. 1A to FIG. 5.

The light emitting structure 120 includes a plurality of mesas M each including the second conductivity type semiconductor layer 125 and the active layer 123. The plurality of mesas M may have an inclined side surface and may be formed by patterning the light emitting structure 120. Each of the mesas M may further include a portion of the first conductivity type semiconductor layer 121. The plurality of mesas M may be disposed in various arrangements on the first conductivity type semiconductor layer 121. For example, as shown in the drawings, the mesas M may be separated from each other and may have an elongated shape extending in one direction to be parallel to each other. However, it should be understood that the shape of the mesas M is not limited thereto. The light emitting structure may include exposed regions of the first conductivity type semiconductor layer 121 around the plurality of mesas M.

The second contact electrode 140 is placed on the plurality of mesas M and forms ohmic contact with the second conductivity type semiconductor layer 125. The second contact electrode 140 includes a conductive oxide layer 141 and a reflective electrode layer 143 disposed on the conductive oxide layer 141. The reflective electrode layer 143 is disposed on the conductive oxide layer 141 and may have a smaller area than the conductive oxide layer 141. Accordingly, the reflective electrode layer 143 may be disposed within an outer peripheral region of the conductive oxide layer 141. Alternatively, the reflective electrode layer 143 may also be formed to cover a side surface of the conductive oxide layer 141.

The insulation layers 150, 160 insulate the first contact electrode 130 and the second contact electrode 140 from each other. The insulation layers 150, 160 are disposed on the light emitting structure 120 and may partially cover first and second contact electrodes 130, 140. Furthermore, the insulation layers 150, 160 may include a first insulation layer 150 and a second insulation layer 160.

The first insulation layer 150 partially covers the upper surface of the light emitting structure 120 and the second contact electrode 140, and covers side surfaces of the mesas M. Further, the first insulation layer 150 may partially cover the partially exposed regions of the first conductivity type semiconductor layer 121 while exposing a portion of the first conductivity type semiconductor layer 121. That is, the first insulation layer 150 may include openings that partially expose the first conductivity type semiconductor layer 121 and the second contact electrode 140.

The regions of the first conductivity type semiconductor layer 121 exposed through the openings of the first insulation layer 150 can be in ohmic contact with the first contact electrode 130 and can be defined as contact regions 120a. The contact regions 120a may be placed around the plurality of mesas M and may have, for example, an elongated shape extending in the extending direction of the mesas M. The mesas M may be disposed between the contact regions 120a.

The first insulation layer 150 may include a pre-insulation layer 150a and a main insulation layer 150b, in which the pre-insulation layer 150a may partially cover the light emitting structure 120 and the conductive oxide layer 141.

The first contact electrode 130 may be placed on the first insulation layer 150 and may partially cover the light emitting structure 120. In addition, the first contact electrode 130 forms ohmic contact with the first conductivity type semiconductor layer 121 through the partially exposed surface of the first conductivity type semiconductor layer 121, that is, through the contact regions 120a. The first contact electrode 130 is formed to cover substantially the entire upper surface of the light emitting structure 120 excluding some regions thereof, thereby further improving current spreading efficiency. Alternatively, the first contact electrode 130 may also be formed to cover the side surface of the light emitting structure 120.

The light emitting device may further include a connection electrode (not shown). The connection electrode may be placed on the second contact electrode 140 and may be electrically connected to the second contact electrode 140 through the openings of the first insulation layer 150. An upper surface of the connection electrode may be generally flush with an upper surface of the first contact electrode 130. In addition, the connection electrode 145 and the first contact electrode 130 may be formed by the same process and may include the same materials.

The second insulation layer 160 may partially cover the first contact electrode 130 and may include a first opening 160a that partially exposes the first contact electrode 130 and a second opening 160b that partially exposes the second contact electrode 140. Each of the first and second openings 160a, 160b may be provided in plural and the second opening 160b may be placed on the mesa M.

The first and second pad electrodes 171, 173 may be electrically connected to the first and second contact electrodes 130, 140 through the first and second openings 160a, 160b, respectively. The first and second pad electrodes 171, 173 may be formed together by the same process, for example, photolithography and etching technology or lift-off technology. Each of the first and second pad electrodes 171, 173 may be composed of a single layer or multiple layers, and may include, for example, a bonding layer such as a Ti layer, a Cr layer or a Ni layer, and a high conductivity metal layer such as an Al layer, a Cu layer, an Ag layer or an Au layer.

Next, a method of fabricating the light emitting device according to this exemplary embodiment will be described. The following description is provided for understanding of the present disclosure and does not limit the scope of the present disclosure.

First, the light emitting structure 120 is formed by growing the first conductivity type semiconductor layer 121, the active layer 123 and the second conductivity type semiconductor layer 125 on the growth substrate 121*a* by MOCVD or the like. Then, the conductive oxide layer 141 including indium tin oxide (ITO) is formed on the light emitting structure 120 by e-beam evaporation or sputtering. With a mask formed on the conductive oxide layer 141, a plurality of mesas M is formed by partially etching the conductive oxide layer 141 and the light emitting structure 120 through the mask. As a result, an outer periphery of the conductive oxide layer 141 may be formed corresponding to an outer periphery of the upper surface of the mesa M. Thereafter, the second contact electrode 140 is formed by forming the reflective electrode layer 143 on the conductive oxide layer 141, and the first insulation layer 150 is formed to cover the light emitting structure 120 and the second contact electrode 140. For the structure wherein the first insulation layer 150 includes the pre-insulation layer 150*a* and the main insulation layer 150*b*, the process of forming the second contact electrode 140 and the process of forming the first insulation layer 150 may be combined, as described above. Then, the contact regions 120*a*, which partially expose the first conductivity type semiconductor layer 121, and the second contact electrode 140 are partially exposed by patterning the first insulation layer 150. Then, the first contact electrode 130 is formed on the first insulation layer 150 by plating, deposition, or the like. After formation of the first contact electrode 130, the second insulation layer 160 is formed to cover substantially the entire upper surface of the first contact electrode 130 and is subjected to patterning to form the first and second openings 160*a*, 160*b*. Thereafter, the first and second pad electrodes 171, 173 are formed on the openings 160*a*, 160*b*, thereby providing the light emitting device, as shown in FIGS. 6 and 7.

According to this exemplary embodiment, the plurality of mesas M and the contact regions 120*a* disposed around the mesas are formed, thereby achieving more efficient current spreading in the lateral direction upon high current operation of the light emitting device.

FIG. 8 and FIG. 9 are plan views and a sectional view of a light emitting device according to yet another exemplary embodiment of the present disclosure. In FIG. 8, (a) is a plan view of the light emitting device according to this exemplary embodiment and (b) is a plan view showing locations of mesas M and contact regions 120*a* in which the first conductivity type semiconductor layer 121 forms ohmic contact with the first contact electrode 130. FIG. 9 is a cross-sectional view taken along line B-B' of FIG. 8.

The light emitting device shown in FIG. 8 and FIG. 9 is different from the light emitting device shown in FIG. 6 and FIG. 7 in that the second insulation layer 160 and the first and second pad electrodes 171, 173 are omitted. The following description will focus on different features of the light emitting device according to this exemplary embodiment, and detailed description of the same components will be omitted.

First, referring to FIG. 8 and FIG. 9, the light emitting device includes a light emitting structure 120, a first contact electrode 130, a second contact electrode 140, a first insulation layer 150, and a connection electrode 145.

The first insulation layer 150 partially covers an upper surface of the light emitting structure 120 and the second contact electrode 140, and covers side surfaces of the mesas M. Furthermore, the first insulation layer 150 may partially cover a partially exposed region of the first conductivity type semiconductor layer 121 while partially exposing the first conductivity type semiconductor layer 121. That is, the first insulation layer 150 may include openings that partially expose the first conductivity type semiconductor layer 121 and the second contact electrode 140. The regions of the first conductivity type semiconductor layer 121 exposed through the openings of the first insulation layer 150 can form ohmic contact with the first contact electrode 130 and can be defined as contact regions 120*a*. The first insulation layer 150 may include a pre-insulation layer 150*a*, which may partially cover the light emitting structure 120 and the conductive oxide layer 141.

The first insulation layer 150 may include first openings 150*a* that expose some regions of the first conductivity type semiconductor layer 121, that is, the contact regions 120*a*, and second openings 150*b* that exposes some regions of the second contact electrode 140. In a structure wherein the light emitting structure 120 is divided into at least two regions, the first openings 150*a* and the second openings 150*b* may be placed in different regions.

For example, the second opening 150*b* may be provided in plural so as to be placed on each of the mesas M. In this structure, the second openings 150*b* may be placed near one side of the light emitting structure 120. Conversely, the first openings 150*a* are placed near longer side surfaces of the mesas M so as to be placed near the other side of the light emitting structure 120 opposite to the one side of the light emitting structure. Assuming that the light emitting structure is divided into a first region R1 and a second region R2 with reference to an imaginary line I defined in a direction orthogonal to the extending direction of the mesas M, the first openings 150*a* may be placed within the first region R1 and the second openings 150*b* may be placed within the second region R2. In this structure, the first and second regions R1, R2 do not overlap each other. Thus, the first openings 150*a* and the second openings 150*b* are placed in different regions instead of being placed in the same region.

The first contact electrode 130 may be placed on the first insulation layer 150 and may partially cover the light emitting structure 120. In addition, the first contact electrode 130 forms ohmic contact with the first conductivity type semiconductor layer 121 through the partially exposed surface of the first conductivity type semiconductor layer 121, that is, through the contact regions 120*a*. On the other hand, the connection electrode 145 may be placed on the second contact electrode 140 and may be electrically connected to the second contact electrode 140 through the openings of the first insulation layer 150. An upper surface of the connection electrode 145 may be generally flush with an upper surface of the first contact electrode 130. In addition, the connection electrode 145 may be formed by the same process as that of the first contact electrode 130, and the connection electrode 145 and the first contact electrode 130 may include the same materials.

In the structure wherein the light emitting structure 120 is divided into at least two regions, the first contact electrode 130 and the connection electrode 145 may be placed in different regions. For example, as shown therein, the first contact electrode 130 may be placed in a first region R1 and the connection electrode 145 may be placed in a second region R2 such that the first contact electrode 130 and the connection electrode 145 are separated from each other. As such, since the first contact electrode 130 and the connection electrode 145 are placed in different regions so as to be separated from each other, the first contact electrode 130 and the connection electrode 145 can act as pad electrodes of the light emitting device, respectively. Accordingly, the first contact electrode 130 can form ohmic contact with the first conductivity type semiconductor layer 121 while acting as a first pad electrode, and the connection electrode 145 may be electrically connected to the second contact electrode 140 so as to act as a second pad electrode.

Next, a method of fabricating the light emitting diode according to this exemplary embodiment will be described. The following description is provided for understanding of the present disclosure and does not limit the scope of the present disclosure.

First, the light emitting structure 120 is formed by growing the first conductivity type semiconductor layer 121, the active layer 123 and the second conductivity type semiconductor layer 125 on the growth substrate 121a by MOCVD or the like. Then, the conductive oxide layer 141 including indium tin oxide (ITO) is formed on the light emitting structure 120 by e-beam evaporation or sputtering. With a mask formed on the conductive oxide layer 141, a plurality of mesas M is formed by partially etching the conductive oxide layer 141 and the light emitting structure 120 through the mask. As a result, an outer periphery of the conductive oxide layer 141 may be formed substantially corresponding to an outer periphery of the upper surface of the mesa M. Thereafter, the second contact electrode 140 is formed by forming the reflective electrode layer 143 on the conductive oxide layer 141 and the first insulation layer 150 is formed to cover the light emitting structure 120 and the second contact electrode 140. For the structure wherein the first insulation layer 150 includes the pre-insulation layer 150a and the main insulation layer 150b, the process of forming the second contact electrode 140 and the process of forming the first insulation layer 150 may be combined, as described above. Then, the first openings 150a exposing the contact regions 120a of the first conductivity type semiconductor layer 121 and the second openings 150b exposing a portion of the second contact electrode 140 are formed by patterning the first insulation layer 150. Then, the first contact electrode 130 and the connection electrode 145 are formed on the first insulation layer 150 by plating, deposition, and the like. In this method, the first contact electrode 130 and the connection electrode 145 are formed to be separated from each other, thereby forming the light emitting device, as shown in FIG. 8 and FIG. 9.

According to this exemplary embodiment, the processes of forming the second insulation layer and the first and second pad electrodes are omitted, thereby simplifying manufacture of the light emitting device. Particularly, it is possible to reduce the number of masks for processes.

FIG. 10 and FIG. 11 are plan views and a sectional view of a light emitting device according to yet another exemplary embodiment of the present disclosure. In FIG. 10, (a) is a plan view of the light emitting device according to this exemplary embodiment and (b) is a plan view showing locations of mesas M and contact regions 120a in which the first conductivity type semiconductor layer 121 forms ohmic contact with the first contact electrode 130. FIG. 11 is a cross-sectional view taken along line C-C' of FIG. 10.

Unlike the light emitting device shown in FIG. 8 and FIG. 9, the light emitting device shown in FIG. 10 and FIG. 11 further includes a first pad electrode 181 and a second pad electrode 183. The following description will focus on different features of the light emitting device according to this exemplary embodiment, and detailed description of the same components will be omitted.

First, referring to FIG. 10 and FIG. 11, the light emitting device includes a light emitting structure 120, a first contact electrode 130, a second contact electrode 140, a first insulation layer 150, and first and second pad electrodes 181, 183.

The first contact electrode 130 forms ohmic contact with a first conductivity type semiconductor layer 121 through contact regions 120a. The first contact electrode 130 is placed on the first conductivity type semiconductor layer 121 to be disposed in a region between the mesas M. Accordingly, in the light emitting device according to this exemplary embodiment, the first contact electrode 130 is not placed on the mesas M, unlike the light emitting devices of the exemplary embodiments described above.

The first pad electrode 181 may be placed on the first insulation layer 150 and may partially cover the light emitting structure 120. In addition, the first pad electrode 181 may partially cover the mesas M and is electrically connected to the first contact electrode 130 disposed on the contact regions 120a. The second pad electrode 183 may be disposed on the second contact electrode 140 and may be electrically connected to the second contact electrode 140 through second openings 150b of the first insulation layer 150. An upper surface of the second pad electrode 183 may be generally flush with an upper surface of the first pad electrode 183. In addition, the first and second pad electrodes 181, 183 may be formed by the same process and may include the same materials. Further, each of the first and second pad electrodes 181, 183 may be composed of a single layer or multiple layers.

In the structure wherein the light emitting structure 120 is divided into at least two regions, the first pad electrode 181 and the second pad electrode 183 may be placed in different regions. For example, as shown in FIG. 10 and FIG. 11, the first pad electrode 181 may be placed in a first region R1 and the second pad electrode 183 may be placed in a second region R2 such that the first pad electrode 181 and the second pad electrode 183 are separated from each other.

Next, a method of fabricating the light emitting diode according to this exemplary embodiment will be described. The following description is provided for understanding of the present disclosure and does not limit the scope of the present disclosure.

First, the light emitting structure 120 is formed by growing the first conductivity type semiconductor layer 121, the active layer 123 and the second conductivity type semiconductor layer 125 on the growth substrate 121a by MOCVD or the like. Then, the conductive oxide layer 141 including indium tin oxide (ITO) is formed on the light emitting structure 120 by e-beam evaporation or sputtering. With a mask formed on the conductive oxide layer 141, a plurality of mesas M is formed by partially etching the conductive oxide layer 141 and the light emitting structure 120 through the mask. As a result, an outer periphery of the conductive oxide layer 141 may be formed substantially corresponding to an outer periphery of the upper surface of the mesa M. Then, the second contact electrode 140 is formed by forming the reflective electrode layer 143 on the conductive oxide layer 141, and the first contact electrode 130 is formed on a portion of the exposed region of the first conductivity type semiconductor layer 121. The first contact electrode 130 and the second contact electrode 140 are formed by plating or deposition. Thereafter, the first insulation layer 150 is formed to cover the light emitting structure 120 and the first and second contact electrodes 130, 140. For the structure wherein the first insulation layer 150 includes the pre-insulation layer 150a and the main insulation layer 150b, the process of forming the second contact electrode 140 and the process of forming the first insulation layer 150 may be combined, as described above. Then, the first openings 150a exposing at least part of the first contact electrode 130 and the second openings 150b exposing a portion the second contact electrode 140 are formed by patterning the first insulation layer 150. Then, the first pad electrode 181 and the second pad electrode 183 are formed on the first insulation layer 150 by plating, deposition, and the like. In this method, the first and second pad electrodes 181, 183 are formed to be separated from each other, thereby forming the light emitting device, as shown in FIG. 10 and FIG. 11.

According to this exemplary embodiment, the process of forming a second insulation layer is omitted, thereby simplifying manufacture of the light emitting device. Particularly, it is possible to reduce the number of masks for processes.

FIG. 12 is a sectional view of a light emitting device according to yet another exemplary embodiment of the present invention.

Unlike the light emitting devices of the above exemplary embodiments, the light emitting device of FIG. 12 may be a vertical type light emitting device in which contact electrodes are disposed in the vertical direction. The following description will focus on different features of the light emitting device according to this exemplary embodiment, and detailed description of the same components will be omitted.

Referring to FIG. 12, the light emitting device according to this exemplary embodiment includes a light emitting structure 120 including a first conductivity type semiconductor layer 121, an active layer 123 and a second conductivity type semiconductor layer 125, a first contact electrode 191, and a second contact electrode 140. The light emitting device may further include an insulation layer 150 and a support electrode 193.

The light emitting structure 120 has a non-polar or semi-polar growth plane. The light emitting structure 120 includes a first surface corresponding to one surface of the first conductivity type semiconductor layer 121 and a second surface disposed opposite to the first surface and corresponding to one surface of the second conductivity type semiconductor layer 125. The first surface includes a region 121s, surface characteristics of which are changed by surface treatment, and the first contact electrode 191 is disposed on the region 121s to form ohmic contact with the first conductivity type semiconductor layer 121. Further, the first surface of the light emitting structure 120 includes a surface 210 having high roughness. The surface 210 includes a plurality of protrusions 211. The plurality of protrusions 211 may be formed in the region 121s, the surface characteristics of which are changed, or may not be formed.

The first conductivity type semiconductor layer 121 includes the region 121s, the surface characteristics of which are changed by surface treatment. Here, when the region 121 having surface characteristics changed by surface treatment is defined as a first region, the remaining region excluding the region 121s can be defined as a second region. Accordingly, the first region and the second region may have different surface characteristics. The region 121s having surface characteristics changed by surface treatment may be formed at a location corresponding to a region 121e in which the first contact electrode 191 will be formed by the subsequent process.

Formation of the region 121s having surface characteristics changed by surface treatment may include surface treatment using at least one of chemical reaction dry etching and laser beams. Particularly, chemical reaction dry etching may include chemical reaction dry etching using $CF_4$ plasma, and surface treatment using a laser may include surface treatment using a KrF laser. Both surface treatment with $CF_4$ plasma chemical reaction dry etching and surface treatment with the KrF laser may be performed in any sequence. For example, $CF_4$ plasma chemical reaction dry etching may be performed as a pretreatment process and surface treatment with the KrF laser may be performed as a main process. Alternatively, the region 121s having the changed surface characteristics may be formed only by plasma chemical reaction dry etching.

The first contact electrode 191 is formed on the region 121s having the changed surface characteristics and forms ohmic contact with the first conductivity type semiconductor layer 121. That is, contact resistance between the first contact electrode 191 and the first region (the region 121s having the changed surface characteristics) of the first conductivity type semiconductor layer 121 is lower than contact resistance between the first contact electrode 191 and the second region (the remaining region excluding the region 121s having the changed surface characteristics).

The first contact electrode 191 may be composed of a single layer or multiple layers and may include a metal, such as Ni, W, Pt, Cu, Ti, Pd, Ta, Au, Ag, Al, Sn, and the like. For example, the first contact electrode 191 may include metal layers composed of multiple layers such as Ti/Al, Ni/Al, Cr/Al, and Pt/Al, and may further include a layer including Ni, W, Pt, Cu, Ti, Pd, Ta, Au, and the like to prevent agglomeration of Al on the multiple layers. The first contact electrode 191 may be formed by plating or deposition. Furthermore, after formation of the first contact electrode 191, additional annealing may be further performed.

In the structure wherein the first conductivity type semiconductor layer 121 has a non-polar or semi-polar growth plane and exhibits n-type conductivity, ohmic contact is unlikely formed between such a non-polar or semi-polar n-type nitride semiconductor and a metal. In addition, even if ohmic contact is formed therebetween, the contact resistance therebetween is high, thereby increasing forward voltage $V_f$ of the light emitting device. According to this exemplary embodiment, the first contact electrode 191 is formed to contact the region 121s of the first conductivity type semiconductor layer 121, which has the changed surface characteristics, thereby enabling formation of ohmic contact having relatively low contact resistance between the first contact electrode 191 and the first conductivity type semiconductor layer 121.

The support electrode 193 is disposed under the second contact electrode 140 to be electrically connected to the second contact electrode 140. In addition, before formation of the support electrode 193, a bonding layer (not shown) may be further formed on the second contact electrode 140. The bonding layer bonds the support electrode 193 to the second contact electrode 140 and can form electrical connection therebetween.

The bonding layer (not shown) may be interposed between the support electrode 193 and the second contact electrode 140 to bond the support electrode 193 to the second contact electrode 140, and may be formed of any material so long as the bonding layer can bond the support electrode 193 to the second contact electrode 140. For example, AuSn may be used to perform eutectic bonding between the second contact electrode 140 and the support electrode 193. Thus, the bonding layer 150 may include AuSn. Eutectic bonding using AuSn may be performed by heating AuSn to a eutectic bonding temperature (about 280° C.) of AuSn or more (for example, about 350° C.), disposing the heated AuSn between the second contact electrode 140 and the support electrode 193, and cooling the AuSn. Further, the bonding layer can electrically connect the second contact electrode 140 to the support electrode 193, whereby the support electrode 193 and the second conductivity type semiconductor layer 125 can be electrically connected to each other. In this case, the support electrode 193 can act as an electrode pad electrically connected to the second contact electrode 140. In this exemplary embodiment, since the support electrode 193 is formed over the entire upper surface of the light emitting structure 120, the support electrode 193 can effectively dissipate heat generated upon operation of the light emitting device.

The support electrode 193 may include a metallic material having electrical conductivity. The support electrode 193 may include, for example, Mo, Cu, Ag, Au, Ni, Ti, Al, and the like, and may be composed of a single layer or multiple layers. The support electrode 193 including such a metallic material may be formed by plating, deposition, and the like.

The light emitting device according to this exemplary embodiment includes the second contact electrode 140, which includes the conductive oxide layer 141, and the first contact electrode 191 formed on the region 121s having the changed surface characteristics, so that ohmic contact between the electrodes and the n-type and p-type semiconductors is relatively low. With this structure, the light emitting device has low forward voltage (Vf) and improved electrical reliability. Furthermore, a roughened surface 210 including a plurality of protrusion 211 is formed on the upper surface of the first conductivity type semiconductor layer 121, thereby improving light extraction efficiency of the light emitting device.

FIG. 13 is an exploded perspective view of one embodiment of a lighting apparatus to which a light emitting device according to one exemplary embodiment is applied.

Referring to FIG. 13, the lighting apparatus according to this embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting device 1021 disposed on the substrate 1023. The light emitting module 1020 may be disposed at an upper portion of the body case 1031 and electrically connected to the power supply 1033.

As the substrate 1023, any substrate capable of supporting the light emitting device 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting device 1021 may include at least one of the light emitting devices according to the exemplary embodiments described above.

The diffusive cover 1010 is disposed on the light emitting device 1021 and may be secured to the body case 1031 to cover the light emitting device 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

FIG. 14 is a cross-sectional view of one embodiment of a display apparatus to which a light emitting device according to one exemplary embodiment of the present disclosure is applied.

The display apparatus according to this embodiment includes a display panel 2110, a backlight unit BLU1 supplying light to the display panel 2110, and a panel guide 2100 supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit BLU1 includes a light source module which includes at least one substrate 2150 and a plurality of light emitting devices 2160. The backlight unit BLU1 may further include a bottom cover 2180, a reflective sheet 2170, a diffusive plate 2131, and optical sheets 2130.

The bottom cover 2180 may be open at an upper side thereof to receive the substrate 2150, the light emitting devices 2160, the reflective sheet 2170, the diffusive plate 2131, and the optical sheets 2130. In addition, the bottom cover 2180 may be coupled to the panel guide. The substrate 2150 may be disposed under the reflective sheet 2170 to be surrounded by the reflective sheet 2170. Alternatively, when a reflective material is coated on a surface thereof, the substrate 2150 may be disposed on the reflective sheet 2170. Further, a plurality of substrates 2150 may be arranged parallel to one another, without being limited thereto. However, it should be understood that the backlight unit includes a single substrate 2150.

The light emitting devices 2160 may include at least one of the light emitting devices according to the exemplary embodiments described above. The light emitting devices 2160 may be regularly arranged in a predetermined pattern on the substrate 2150. In addition, a lens 2210 may be disposed on each of the light emitting devices 2160 to improve uniformity of light emitted from the plurality of light emitting devices 2160.

The diffusive plate 2131 and the optical sheets 2130 are disposed above the light emitting device 2160. Light emitted from the light emitting devices 2160 may be supplied in the form of sheet light to the display panel 2110 through the diffusive plate 2131 and the optical sheets 2130.

In this way, the light emitting devices according to the exemplary embodiments may be applied to direct type displays like the display apparatus according to this embodiment.

FIG. 15 is a cross-sectional view of another embodiment of the display apparatus to which a light emitting device according to one exemplary embodiment of the present disclosure is applied.

The display apparatus according to this embodiment includes a display panel 3210 on which an image is displayed, and a backlight unit BLU2 disposed at a rear side of the display panel 3210 and emitting light thereto. Further, the display apparatus includes a frame 240 supporting the display panel 3210 and receiving the backlight unit BLU2, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower side surfaces thereof, and the cover 3280 disposed at the lower side of the display panel 3210 may be coupled to the backlight unit BLU2.

The backlight unit BLU2 supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit BLU2 according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting devices 3110 arranged at constant intervals on one surface of the substrate 3220. As the substrate 3220, any substrate capable of supporting the light emitting devices 3110 and being electrically connected thereto may be used without limitation. For example, the substrate 3220 may include a printed circuit board. The light emitting devices 3110 may include at least one of the light emitting devices according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting devices 3110 into sheet light.

In this way, the light emitting devices according to the exemplary embodiments may be applied to edge type displays like the display apparatus according to this exemplary embodiment.

FIG. 16 is a cross-sectional view of a headlight to which a light emitting device according to one exemplary embodiment of the present disclosure is applied.

Referring to FIG. 16, the headlight according to this embodiment includes a lamp body 4070, a substrate 4020, a light emitting device 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting device 4010 may be used without limitation. For example, the substrate 4020 may include a substrate having a conductive pattern, such as a printed circuit board. The light emitting device 4010 is disposed on the substrate 4020 and may be supported and secured by the substrate 4020. In addition, the light emitting device 4010 may be electrically connected to an external power source through the conductive pattern of the substrate 4020. Further, the light emitting device 4010 may include at least one of the light emitting devices according to the exemplary embodiments described above.

The cover lens 4050 is disposed on a path of light emitted from the light emitting device 4010. For example, as shown in the drawing, the cover lens 4050 may be spaced apart from the light emitting device 4010 by the connection member 4040 and may be disposed in a direction of supplying light emitted from the light emitting device 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting device 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting device 4010.

In this way, the light emitting device according to the exemplary embodiment may be applied to headlights, particularly, headlights for vehicles, like the headlight according to this embodiment.

Although certain exemplary embodiments have been described herein, it should be understood by those skilled in the art that these embodiments are given by way of illustration only, and that various modifications, variations, and alterations can be made without departing from the spirit and scope of the present disclosure. Therefore, the scope of the present disclosure should be limited only by the accompanying claims and equivalents thereof.

The invention claimed is:

1. A light emitting device comprising:
    a light emitting structure comprising a first conductivity type semiconductor layer, a second conductivity type semiconductor layer, and an active layer interposed between the first conductivity type semiconductor layer and the second conductivity type semiconductor layer;
    a first contact electrode in ohmic contact with the first conductivity type semiconductor layer;
    a second contact electrode disposed on the second conductivity type semiconductor layer; and
    an insulation layer disposed on the light emitting structure and insulating the first contact electrode from the second contact electrode,
    wherein the light emitting structure includes a non-polar or semi-polar growth plane, an upper surface of the second conductivity type semiconductor layer comprises a non-polar or semi-polar plane, and the second contact electrode comprises a conductive oxide layer in ohmic contact with the second conductivity type semiconductor layer and a reflective electrode layer disposed on the conductive oxide layer.

2. The light emitting device according to claim 1, wherein the light emitting structure comprises a nitride semiconductor and the non-polar or semi-polar growth plane comprises an m-plane.

3. The light emitting device according to claim 2, wherein the conductive oxide layer comprises indium tin oxide (ITO) and the reflective electrode layer comprises Ag.

4. The light emitting device according to claim 1, wherein the conductive oxide layer has a larger area than the reflective electrode layer and the reflective electrode layer is disposed in a peripheral region of the conductive oxide layer.

5. The light emitting device according to claim 4, wherein the conductive oxide layer covers at least 90% of an upper surface of the second conductivity type semiconductor layer.

6. The light emitting device according to claim 1, wherein the conductive oxide layer is covered by the reflective electrode layer.

7. The light emitting device according to claim 1, wherein the first conductivity type semiconductor layer comprises a nitride-based substrate having a non-polar or semi-polar growth plane.

8. The light emitting device according to claim 7, wherein the nitride-based substrate is undoped or doped and when the nitride-based substrate is doped, the nitride-based substrate exhibits the same conductivity type as the first conductivity type semiconductor layer.

9. The light emitting device according to claim 7, wherein the nitride-based substrate has a thickness of 270 µm to 330 µm.

10. The light emitting device according to claim 1, wherein contact resistance between the second conductivity type semiconductor layer and the conductive oxide is lower than contact resistance between the second conductivity type semiconductor layer and the reflective metal layer.

11. The light emitting device according to claim 1, wherein the light emitting structure comprises a plurality of mesas comprising the second conductivity type semiconductor layer and the active layer, the second contact electrode is disposed on the plurality of mesas, and the first conductivity type semiconductor layer is exposed in at least some regions around the plurality of mesas.

12. The light emitting device according to claim 11, wherein the insulation layer comprises a first insulation layer and a second insulation layer,
the first insulation layer covering the plurality of mesas and the first conductivity type semiconductor layer,
the first insulation layer comprising a first opening and a second opening partially exposing the first conductivity type semiconductor layer and the second contact electrode, respectively.

13. The light emitting device according to claim 12, wherein the first contact electrode forms ohmic contact with the first conductivity type semiconductor layer through the first opening, and is disposed on a part of upper surfaces of the plurality of mesas and on side surfaces of the plurality of mesas and is insulated from the plurality of mesas.

14. The light emitting device according to claim 13, wherein the second insulation layer partially covers the first contact electrode, and comprises a third opening and a fourth opening partially exposing the first contact electrode and the second contact electrode, respectively.

15. The light emitting device according to claim 14, further comprising:
a first pad electrode disposed on the second insulation layer and electrically connected to the first contact electrode through the third opening; and
a second pad electrode disposed on the second insulation layer and electrically connected to the second contact electrode through the fourth opening.

16. The light emitting device according to claim 11, wherein the insulation layer covers the plurality of mesas and the first conductivity type semiconductor layer, and comprises a first opening and a second opening partially exposing the first conductivity type semiconductor layer and the second contact electrode, respectively.

17. The light emitting device according to claim 16, wherein the first contact electrode forms ohmic contact with the first conductivity type semiconductor layer through the first opening, and the first contact electrode is disposed on part of upper surfaces of the plurality of mesas and on a part of side surfaces of the plurality of mesas and is insulated from the plurality of mesas.

18. The light emitting device according to claim 17, further comprising:
a pad electrode disposed on the insulation layer and electrically connected to the second contact electrode through the second opening,
wherein the pad electrode is separated from the first contact electrode.

19. The light emitting device according to claim 18, wherein the light emitting structure comprises a first region comprising a first side of the light emitting structure and a second region comprising a second side of the light emitting structure, the second side opposite to the first side of the light emitting structure,
the first contact electrode being disposed in the first region,
the pad electrode being disposed in the second region.

20. The light emitting device according to claim 11, wherein the first contact electrode is disposed on at least part of the exposed region of the first conductivity type semiconductor layer.

21. The light emitting device according to claim 20, wherein the insulation layer covers the plurality of mesas and the first conductivity type semiconductor layer, and comprises a first opening and a second opening partially exposing the first contact electrode and the second contact electrode, respectively.

22. The light emitting device according to claim 21, further comprising:
a first pad electrode disposed on the insulation layer and electrically connected to the first contact electrode through the first opening; and
a second pad electrode disposed on the insulation layer and electrically connected to the second contact electrode through the second opening,
wherein the first pad electrode is disposed on a part of upper surfaces of the plurality of mesas and on side surfaces of the plurality of mesas and is separated from the plurality of mesas by the insulation layer.

23. The light emitting device according to claim 1, wherein the light emitting structure comprises a region where the first conductivity type semiconductor layer is partially exposed, and the insulation layer comprises a first insulation layer,
the first insulation layer partially covering the light emitting structure and the second contact electrode, the first insulation layer comprising a first opening and a second opening partially exposing the first conductivity type semiconductor layer and the second contact electrode, respectively.

24. The light emitting device according to claim 23, wherein the first insulation layer comprises a pre-insulation layer and a main insulation layer disposed on the pre-insulation layer, and the pre-insulation layer partially covers the light emitting structure and the conductive oxide.

25. The light emitting device according to claim 24, wherein the pre-insulation layer comprises an opening partially exposing the conductive oxide and the reflective electrode layer is disposed inside the opening.

26. The light emitting device according to claim 25, wherein the main insulation layer partially covers the reflective electrode layer.

27. The light emitting device according to claim 24, wherein the insulation layer further comprises a second insulation layer disposed on the first insulation layer and partially covering the first contact electrode, and the first insulation layer is thicker than the second insulation layer.

28. The light emitting device according to claim 1, wherein the light emitting structure comprises a first surface corresponding to one surface of the first conductivity type semiconductor layer and a second surface corresponding to one surface of the second conductivity type semiconductor layer, and the first surface of the light emitting structure comprises a roughened surface having a plurality of protrusions, each of the protrusions comprising at least three side surfaces inclined at different angles with respect to the first surface.

29. The light emitting device according to claim 28, wherein each of the protrusions comprises first to third side surfaces,
an angle defined between the first side surface and the first surface is greater than an angle defined between the second side and the first surface, and
an angle defined between the third side surface and the first surface is greater than an angle defined between the first side surface and the first surface.

30. The light emitting device according to claim 29, wherein the first side surface is interposed between the second side surface and the third side surface.

31. The light emitting device according to claim 29, wherein the protrusions have a pentagonal shape in horizontal cross-sectional view.

32. The light emitting device according to claim 31, wherein each of the protrusions has two first side surfaces, two second side surfaces, and one third side surface.

33. The light emitting device according to claim 32, wherein the two first side surfaces are separated from each other and the two second side surfaces are disposed adjacent to each other.

34. The light emitting device according to claim 31, wherein the light emitting structure has an m-plane as a growth plane.

35. The light emitting device according to claim 28, wherein a side surface of each protrusion comprises a curved surface.

36. The light emitting device according to claim 28, wherein the protrusions have a height of 3 µm or more.

37. The light emitting device according to claim 28, wherein an area of a portion of the first surface occupied by the protrusions is 80% or more of a total area of the first surface.

38. The light emitting device according to claim 37, wherein at least some protrusions adjoin each other.

39. The light emitting device according to claim 28, wherein each of the at least three side surfaces has an inclination of 40 degrees or more with respect to the first surface.

40. The light emitting device according to claim 28, wherein the first surface of the light emitting structure further comprises sub-protrusions formed thereon.

41. The light emitting device according to claim 40, wherein the sub-protrusions have a nanometer scale.

42. The light emitting device according to claim 28, wherein the side surfaces of the protrusions comprise at least one crystal plane.

43. The light emitting device according to claim 28, wherein the first conductivity type semiconductor layer comprises a nitride-based substrate having a non-polar or semi-polar growth plane, and the first surface is one surface of the nitride-based substrate.

44. The light emitting device according to claim 28, wherein the second contact electrode is disposed on the second surface, and the second contact electrode comprises a conductive oxide layer in ohmic contact with the second conductivity type semiconductor layer and a reflective electrode layer disposed on the conductive oxide layer.

45. The light emitting device according to claim 44, wherein the conductive oxide layer comprises ITO and the reflective electrode layer comprises Ag.

* * * * *